(12) United States Patent
Tsurume

(10) Patent No.: US 8,598,574 B2
(45) Date of Patent: Dec. 3, 2013

(54) LIGHT-EMITTING DEVICE

(75) Inventor: Takuya Tsurume, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 18 days.

(21) Appl. No.: 13/366,519

(22) Filed: Feb. 6, 2012

(65) Prior Publication Data

US 2012/0199869 A1   Aug. 9, 2012

(30) Foreign Application Priority Data

Feb. 9, 2011  (JP) .................................. 2011-025844

(51) Int. Cl.
*H01L 51/52* (2006.01)
(52) U.S. Cl.
USPC   257/40; 257/99; 257/E51.019; 257/E51.022; 257/E33.065
(58) Field of Classification Search
USPC .................................................. 257/E51.019
See application file for complete search history.

(56) References Cited

U.S. PATENT DOCUMENTS

| | | | |
|---|---|---|---|
| 6,608,449 B2 | 8/2003 | Fukunaga | |
| 6,768,260 B2 | 7/2004 | Fukunaga et al. | |
| 6,825,496 B2 | 11/2004 | Yamazaki et al. | |
| 6,876,007 B2 | 4/2005 | Yamazaki et al. | |
| 7,161,184 B2 | 1/2007 | Miyagi et al. | |
| 7,221,095 B2 | 5/2007 | Yamazaki et al. | |
| 7,242,024 B2 | 7/2007 | Yamazaki et al. | |
| 7,528,418 B2 | 5/2009 | Yamazaki et al. | |
| 7,692,199 B2 | 4/2010 | Arai | |
| 7,733,441 B2 | 6/2010 | Seo et al. | |
| 7,808,002 B2 | 10/2010 | Yamazaki et al. | |
| 8,049,333 B2 | 11/2011 | Alden et al. | |
| 2007/0074316 A1* | 3/2007 | Alden et al. | 977/762 |
| 2007/0252524 A1* | 11/2007 | Lee et al. | 313/509 |
| 2008/0311692 A1* | 12/2008 | Lee et al. | 438/29 |
| 2009/0152539 A1* | 6/2009 | Yamazaki et al. | 257/40 |
| 2010/0006882 A1 | 1/2010 | Arai | |
| 2011/0284913 A1* | 11/2011 | Ibe et al. | 257/99 |

FOREIGN PATENT DOCUMENTS

JP   2009-130132   6/2009

OTHER PUBLICATIONS

Queen, D.R., Morford, J. "Transparent Indium Tin Oxide Films Prepared by Reactive Thermal Evaporation in the U.C. Berkely Microlab", U.C. Berkeley Microfabrication Laboratory, Feb. 25, 2009.*
Trottier, C. M., P. Glatkowski, P. Wallis, and J. Luo. "Properties and Characterization of Carbon-nanotuve-based Transparent Conductive Coating." Journal of the Society of Information Display 13.9 (2005): 759-63.*
Resistivity of Aluminum, The Physics Fact Book, Edited by Glen Elert downloaded from URL <http://hypertextbook.com/facts/2004/ValPolyakov.shtml> on Apr. 3, 2013.*

* cited by examiner

*Primary Examiner* — Thomas L Dickey
*Assistant Examiner* — Joseph Schoenholtz
(74) *Attorney, Agent, or Firm* — Husch Blackwell LLP

(57) ABSTRACT

To provide a light-emitting device having a top-emission structure with low power consumption. A convex structure body is formed over a substrate to be provided with an organic EL element, and then an upper electrode layer is formed. Thus, the upper electrode layer has a shape following the convex shape. In addition, a conductive layer is formed over a substrate sealing an organic EL layer. Then, by sealing a surface where the upper electrode layer is formed and a surface where the conductive layer is formed are sealed to face each other, at least part of the electrode layer overlapped with the convex structure body is in contact with the conductive layer, so that the resistivity of the upper electrode layer is significantly reduced. Thus, power consumption of a light-emitting element can be reduced.

22 Claims, 12 Drawing Sheets

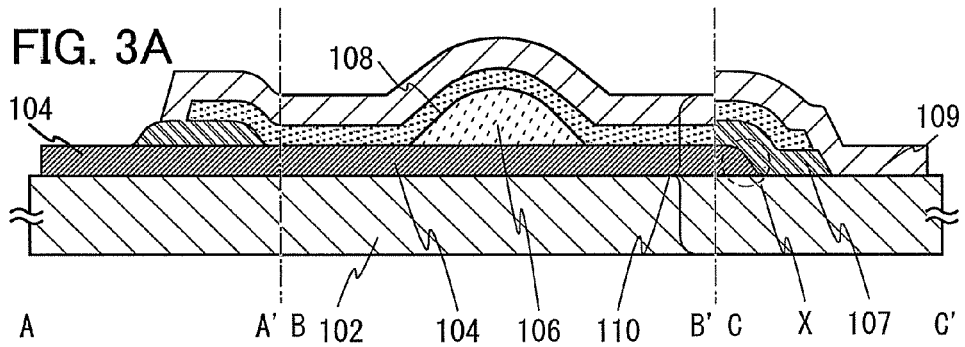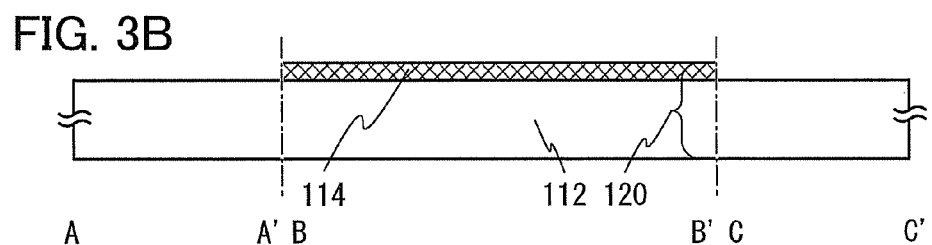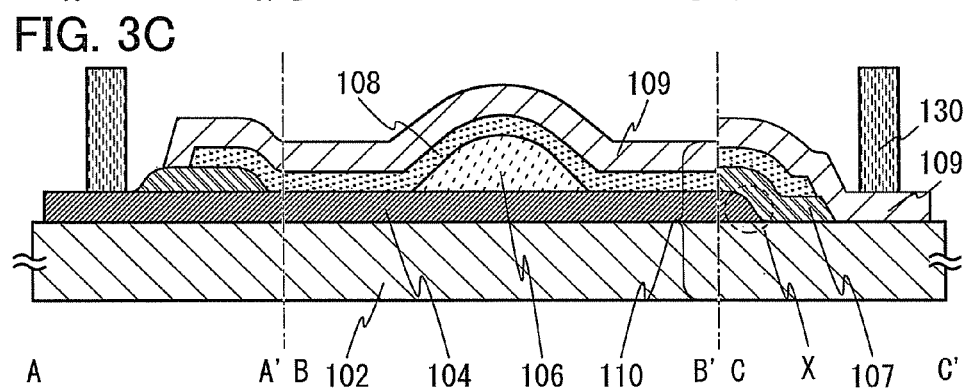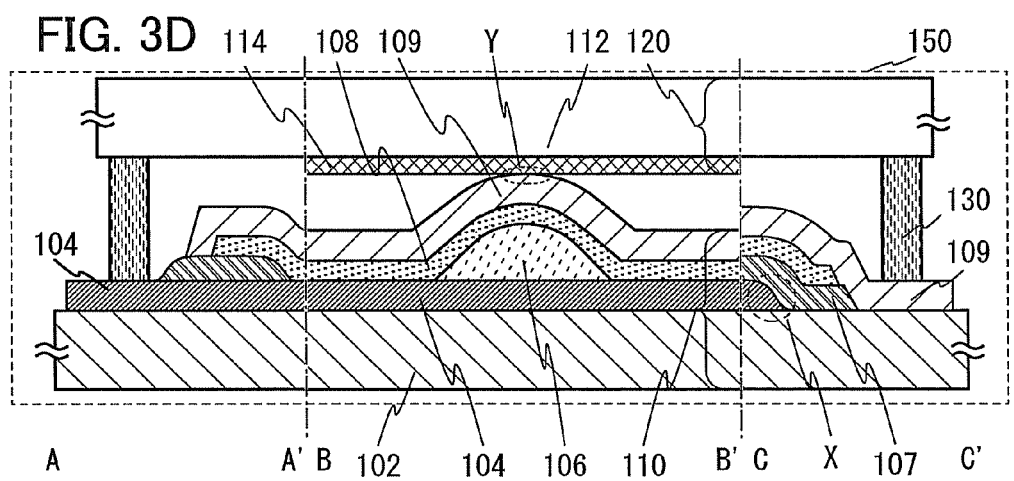

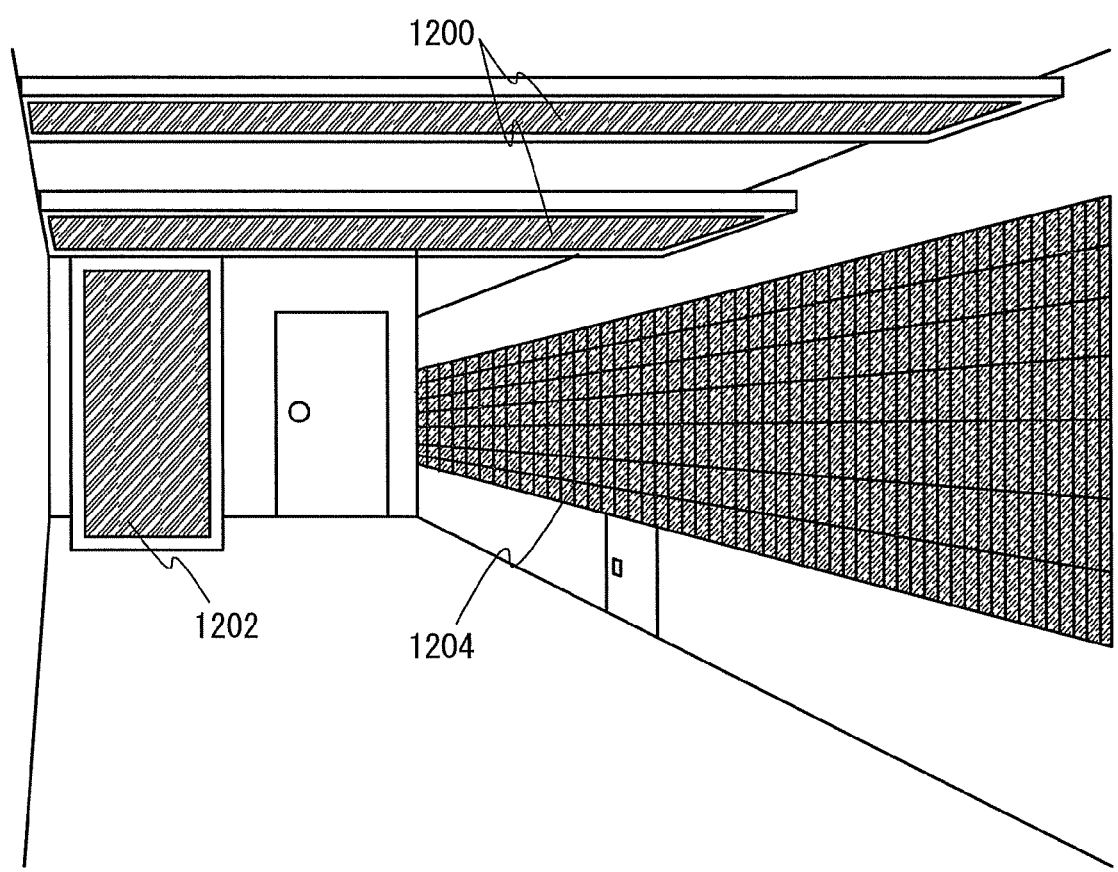

LIGHT-EMITTING DEVICE

BACKGROUND OF THE INVENTION

1. Field of the Invention

The present invention relates to a light-emitting device including an organic EL element.

2. Description of the Related Art

Instead of light-emitting devices such as incandescent lamps and fluorescent lamps which have been used for a long time, in recent years, a light-emitting device using an element (hereinafter, abbreviated to an organic EL element) in which a functional organic thin film layer (hereinafter, abbreviated to an organic. EL layer) which emits light by applying current is interposed between electrodes has been actively researched. A light-emitting device including an organic EL element has advantages that reduction in thickness and weight is easily conducted as compared to conventional light-emitting devices. An application in which the light-emitting device is attached-on a curved surface utilizing these advantages is considered.

As an example of a light-emitting device including an organic EL element, a lighting device is disclosed in Patent Document 1.

[Reference]
[Patent Document 1] Japanese Published Patent Application No. 2009-130132

SUMMARY OF THE INVENTION

The structure of an organic EL element in Patent Document 1 is a structure in which a transparent electrode, an organic light-emitting layer, and a metal reflection electrode are formed over a light-transmitting substrate in this order and the organic light-emitting layer is air-sealed using a sealing layer and is a so-called bottom-emission structure in which light is emitted to a structure side on which the organic light-emitting layer is formed (a light-transmitting substrate side in Patent Document 1).

In a bottom-emission structure, in order to reduce resistivity of a transparent electrode, a metal film having low resistivity is generally formed as an auxiliary wiring between a light-transmitting substrate and the transparent electrode. Since a glass substrate is generally used as the light-transmitting substrate and has high heat resistance, the auxiliary wiring can be formed with relative ease. As a formation method of the auxiliary wiring, for example, a method by which a conductive paste is printed over a light-transmitting substrate and baking treatment is performed as appropriate, so that a printed electrode is formed can be given.

As described above, a bottom-emission structure has an advantage that an auxiliary wiring is easily formed.

As the structure of an organic EL element, other than a bottom-emission structure, a top-emission structure can be given in which light is emitted to a structure side on which an organic light-emitting layer is not formed (a sealing layer side in Patent Document 1).

Since a transparent electrode is formed after an organic EL layer is forMed in a top-emission structure, in the case where an auxiliary wiring is formed in contact with the transparent electrode, patterning formation by etching treatment is difficult to perform as well as there is limitation on heating temperature. Therefore, it is extremely difficult to reduce the resistivity of the transparent electrode by providing an auxiliary wiring, and variation in resistance value occurs in a plane in the case where the transparent electrode is formed in a large area. Accordingly, the following problems are likely to occur: power consumption is high and variation in light emission occurs.

The present invention is made in view of the foregoing technical background. Therefore, it is an object of the present invention to provide a light-emitting device having a top-emission structure with low power consumption.

It is another object to provide a light-emitting device having a top-emission structure in which variation in light emission in a plane is suppressed.

It is another object to provide a light-emitting device having a top-emission structure with a high heat dissipation property.

In order to achieve any of the above objects, in one embodiment of the present invention, a structure body is formed over a substrate (hereinafter, abbreviated to a first substrate) including a first electrode layer, an organic EL element, and a second electrode layer (hereinafter, a stacked-layer structure from the first substrate to the second electrode layer is collectively abbreviated to a "base substrate"). Thus, at least part of the second electrode layer which is overlapped with the structure body bulges as compared to a portion of the second electrode layer which is not overlapped with the structure body.

Further, a conductive layer is formed over a substrate (hereinafter, abbreviated to a second substrate) used for sealing the organic EL layer (hereinafter, the second substrate where the conductive layer is formed is collectively abbreviated to a "sealing substrate"). In addition, by sealing the second electrode layer side of the base substrate and the conductive layer side of the sealing substrate to face each other, the portion of the second electrode layer which is overlapped with the structure body on the base substrate side is in contact with the conductive layer formed over the sealing substrate, so that the resistivity of the second electrode layer is significantly reduced. Therefore, power consumption of the light-emitting device having a top-emission structure can be reduced and variation in light emission can be suppressed.

Furthermore, with the use of a substrate having high heat conductivity as the first substrate, heat from the organic EL layer is efficiently released to the outside through the first substrate. Therefore, the light-emitting device having a top-emission structure can have a high heat dissipation property.

In other words, one embodiment of the present invention is a light-emitting device having a structure in which a base substrate including a first electrode layer over a first substrate, an organic EL layer over the first electrode layer, a second electrode layer over the organic EL layer, and a convex structure body provided between the first electrode layer and the organic EL layer so that the second electrode layer partly bulges and a sealing substrate including a conductive layer over a second substrate are bonded to each other. The conductive layer has lower resistivity than the second electrode layer. At least part of the second electrode layer overlapped with the structure body is in contact with and electrically connected to the conductive layer. A surface of the base substrate where the second electrode layer is formed and a surface of the sealing substrate where the conductive layer is formed are bonded to face each other.

According to the above embodiment of the present invention, the second electrode layer and the conductive layer are in contact with each other, and the resistivity of the second electrode layer can be reduced; therefore, a light-emitting device having a top-emission structure in which power consumption is low and variation in light emission is suppressed can be provided.

One embodiment of the present invention is a light-emitting device having a structure in which a base substrate including a first electrode layer over a first substrate, an organic EL layer over the first electrode layer, a second electrode layer over the organic EL layer, and a convex structure body provided between the first substrate and the first electrode layer so that the second electrode layer partly bulges and a sealing substrate including a conductive layer over a second substrate are bonded to each other. The conductive layer has lower resistivity than the second electrode layer. At least part of the second electrode layer overlapped with the structure body is in contact with and electrically connected to the conductive layer. A surface of the base substrate where the second electrode layer is formed and a surface of the sealing substrate where the conductive layer is formed are bonded to face each other.

According to the above embodiment of the present invention, the second electrode layer and the conductive layer are in contact with each other, and the resistivity of the second electrode layer can be reduced. In addition, since a portion where the structure body is formed also serves as a light-emitting portion, a light-emitting device having a top-emission structure in which power consumption is low and variation in light emission is suppressed can be provided.

Note that in the above embodiment of the present invention, when the conductive layer includes a minute metal wiring of gold, silver, copper, tin, aluminum, nickel, cobalt, or an alloy of any of these materials, a carbon nanotube, a minute metal particle, or a combination of minute metal particles and has visible light transmittance of greater than or equal to 60%, light from the organic EL layer is efficiently emitted to the outside with less influence of reflection and absorption due to the conductive layer; therefore, a light-emitting device having a top-emission structure with low power consumption can be provided.

In the above embodiment of the present invention, when the conductive layer is a single-layer film or a stacked-layer film of one or more of gold, platinum, silver, copper, aluminum, titanium, nickel, cobalt, chromium, tungsten, molybdenum, and an alloy material containing the above metal material as its main component and has visible light transmittance of greater than or equal to 60%, light from the organic EL layer is efficiently emitted to the outside with less influence of reflection and absorption due to the conductive layer; therefore, a light-emitting device having a top-emission structure with low power consumption can be provided.

In the above embodiment of the present invention, when the resistivity of the conductive layer is less than or equal to $3 \times 10^{-4}$ $\Omega \cdot m$ and part of the conductive layer and part of the second electrode layer are in contact with each other, the resistivity of the second electrode layer can be significantly reduced; therefore, a light-emitting device having a top-emission structure with low power consumption can be provided.

In the above embodiment of the present invention, when the contact portion between the second electrode layer and the conductive layer is formed to have a linear shape, in addition to reduction in resistivity of the second electrode layer, variation in resistance value in a plane can be suppressed; therefore, a light-emitting device having a top emission structure in which variation in light emission is suppressed can be provided.

In the above embodiment of the present invention, when a substrate formed of a material having high thermal conductivity of greater than or equal to 10 $W \cdot m^{-1} \cdot K^{-1}$ is used as the first substrate, heat from light emitted from the organic EL layer can be efficiently released to the outside through the first substrate; therefore, a light-emitting device having a top-emission structure with a high heat dissipation property can be provided.

In the above embodiment of the present invention, when unevenness is formed on a surface of the first substrate which is different from a surface where the structure body is formed, heat from light emitted from the organic EL layer can be more efficiently released to the outside; therefore, a light-emitting device having a top-emission structure with a high heat dissipation property can be provided.

When the expression "B is formed over A" or "B is formed on A" is explicitly described in this specification and the like, it does not necessarily mean that B is formed in direct contact with A. The expression includes the case where A and B are not in direct contact with each other, i.e., the case where another object is interposed between A and B. In this case, each of A and B is intended to be an object (e.g., a device, an element, a circuit, a wiring, an electrode, a terminal, a film, or a layer).

Therefore, for example, when the expression that a layer B is formed on or over a layer A is explicitly described, it includes both the case where the layer B is formed in direct contact with the layer A, and the case where another layer (e.g., a layer C or a layer D) is formed in direct contact with the layer A and the layer B is formed in direct contact with the layer C or the layer D. Note that another layer (e.g., the layer C or the layer D) may be a single layer or a plurality of layers.

Note that in this specification and the like, the ordinal number such as "first" or "second" is given for convenience to distinguish elements, and not given to limit the number, the arrangement, and the order of the steps.

According to one embodiment of the present invention, a light-emitting device having a top-emission structure in which power consumption is low and variation in light emission is suppressed can be provided.

Alternatively, a light-emitting device having a top-emission structure with a high heat dissipation property can be provided.

BRIEF DESCRIPTION OF THE DRAWINGS

FIGS. 3A to 3D illustrate the method for manufacturing the light-emitting device described in Embodiment 1.

FIG. 12 illustrates embodiments of a lighting device and an electronic device to which a light-emitting device according to the present invention is applied.

DETAILED DESCRIPTION OF THE INVENTION

Figure 1A:
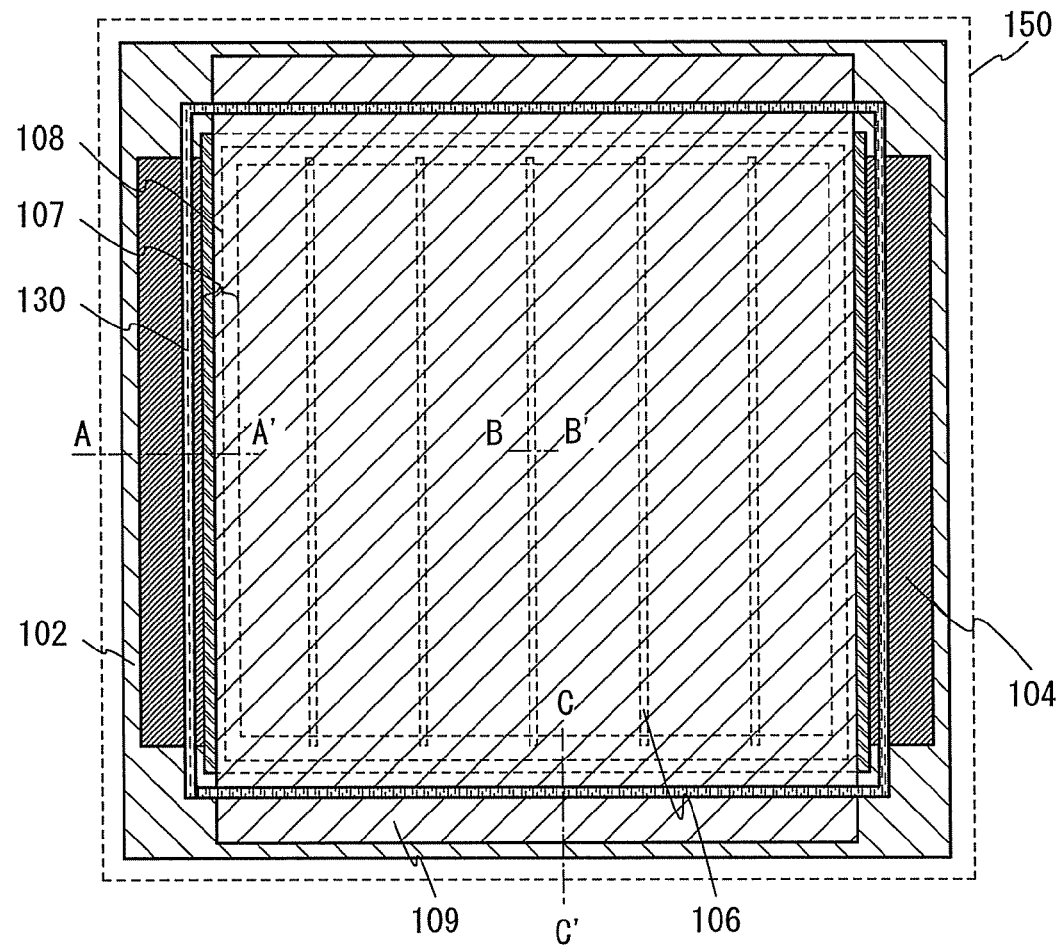
FIGS. 1A and 1B illustrate a structure of a light-emitting device described in Embodiment 1.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a structure and a manufacturing method of a light-emitting device according to one embodiment of the invention disclosed herein will be described with reference to FIGS. 1A and 1B, FIGS. 2A to 2D, FIGS. 3A to 3D, and FIGS. 4A to 4C.

<Structure of Light-Emitting Device in this Embodiment>

Figure 1B:
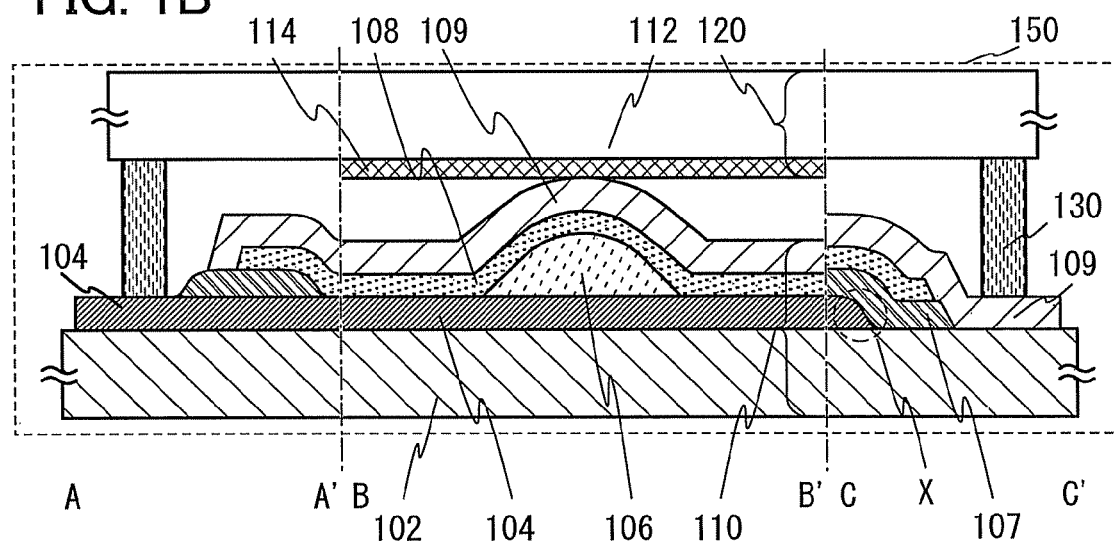

FIGS. 1A and 1B are diagrams illustrating an example of a structure of a light-emitting device manufactured by a method in this embodiment. FIG. 1A is a top view of a light-emitting device 150 and FIG. 1B is a cross-sectional view taken along dashed-dotted lines A-A', B-B', and C-C' in FIG. 1A. Note that a second substrate 112 and a conductive layer 114 are not illustrated in FIG. 1A for simplicity.

The light-emitting device 150 in FIGS. 1A and 1B includes a base substrate 110 including a first substrate 102, a first electrode layer 104 formed over the first substrate 102, a structure body 106 and an insulator 107 fanned over the first electrode layer 104, an organic EL layer 108 formed over the first electrode layer 104 and the structure body 106, and a second electrode layer 109 formed over the organic EL layer 108, and a sealing substrate 120 including the second substrate 112 and the conductive layer 114 formed over the second substrate 112. The base substrate 110 and the sealing substrate 120 are bonded to each other with a sealant 130.

The thickness of the structure body 106 is larger than that of the insulator 107. Thus, after the base substrate 110 is formed, a region of the second electrode layer 109 overlapped with the structure body 106 has the highest thickness in the base substrate 110; therefore, when the sealing substrate 120 is bonded to the base substrate 110, the conductive layer 114 is selectively in contact with the region of the second electrode layer 109 overlapped with the structure body 106.

The second electrode layer 109 and the conductive layer 114 are partly in contact with and are electrically connected to each other. Parts of the first electrode layer 104 and the second electrode layer 109 are led to an outer side of the sealant 130 and an external power source (not illustrated) is connected to the first electrode layer 104 and the second electrode layer 109 to supply electrons and holes to the organic EL layer 108, so that the organic EL layer 108 can emit light.

One of the first electrode layer 104 and the second electrode layer 109 serves as an anode and the other serves as a cathode. Holes injected from the anode and electrons injected from the cathode are recombined in the organic EL layer 108, whereby light is emitted. In this embodiment, the first electrode layer 104 serves as a cathode, and the second electrode layer 109 serves as an anode.

The organic EL layer 108 includes at least a light-emitting layer which emits light by recombination of electrons and holes. In order to improve light-emitting performance of the organic EL layer 108, a hole-injection layer, a hole-transport layer, an electron-transport layer, and an electron-injection layer are provided. The hole-transport layer is provided between the anode and the light-emitting layer. In addition, the hole-injection layer is provided between the anode and the light-emitting layer or between the anode and the hole-transport layer. On the other hand, the electron-transport layer is provided between the cathode and the light-emitting layer. The electron-injection layer is provided between the cathode and the light-emitting layer or between the cathode and the electron-transport layer. Note that the hole-injection layer, the hole-transport layer, the electron-transport layer, and the electron-injection layer, all of which are not necessarily provided, may be selected as appropriate depending on required performance or the like.

Note that in FIG. 1B, the organic EL layer 108 is provided as a single layer between the first electrode layer 104 and the second electrode layer 109; however, a structure in which a plurality of organic EL layers are stacked (a so-called tandem structure) can also be applied. In particular, with a two-layer to four-layer (preferably, three-layer) structure, a light-emitting device having well-balanced emission efficiency with respect to power consumption can be manufactured.

The insulator 107 (referred to as a partition, a barrier, an insulating material, or the like) has the effect of suppressing film disconnection of the organic EL layer 108 due to an uneven portion formed over the first substrate 102 (e.g., an end portion of the first electrode layer 104 which is illustrated in an X portion surrounded by a dotted line (a circular portion) in FIG. 1B). When the end portion of the insulator 107 is gently angled, the film disconnection of the organic EL layer 108 can be effectively suppressed. In addition, the insulator 107 also has the effect of suppressing occurrence of a short circuit due to contact between the first electrode layer 104 and the second electrode layer 109.

Although the insulator 107 is formed in this embodiment, it is not necessarily formed if the film disconnection of the organic EL layer 108 and the short circuit between the first electrode layer 104 and the second electrode layer 109 which are described above do not occur.

<Method for Manufacturing Light-Emitting Device in this Embodiment>

A method for manufacturing the light-emitting device 150 is described below with reference to FIGS. 2A to 2D and FIGS. 3A to 3D.

Figure 2A:
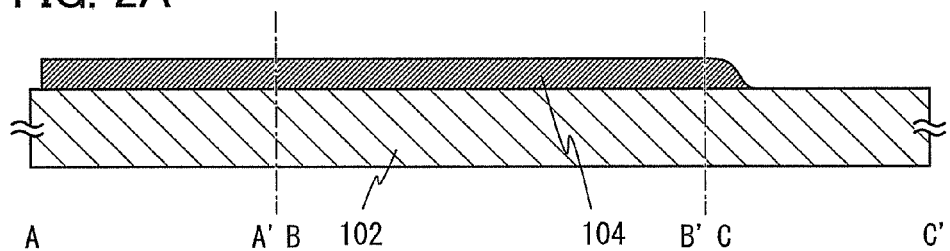
FIGS. 2A to 2D illustrate a method for manufacturing the light-emitting device described in Embodiment 1.

First, the first electrode layer 104 is formed over the first substrate 102 (see FIG. 2A).

As the first substrate 102, a substrate having high thermal conductivity, for example, a metal substrate such as a stainless steel substrate, an aluminum substrate, an aluminum bronze substrate, a titanium substrate, a copper substrate, an iron substrate, a carbon steel substrate, a chromium steel substrate, a nickel steel substrate, a chromium nickel steel substrate, a silicon steel substrate, a tungsten steel substrate, or a manganese steel substrate, a ceramic substrate such as an aluminum nitride substrate or an alumina substrate, or the like, can be used. A material having thermal conductivity of greater than or equal to $10\ \text{W·m}^{-1}\text{·K}^{-1}$ is preferably used. More preferably, a material having thermal conductivity of greater than or equal to $50\ \text{W·m}^{-1}\text{·K}^{-1}$ is used.

With the use of such a substrate having high thermal conductivity as the first substrate 102, heat from the organic EL layer 108 when the light-emitting device 150 is operated can be efficiently released to the outside through the first substrate 102. Thus, deterioration of the organic EL layer 108 (e.g., an organic material contained in the organic EL layer 108 is crystallized due to heat) can be suppressed, so that the light-emitting device 150 can have a long lifetime.

As the first substrate 102, for example, any of a variety of glass substrates formed of general flat glass, clear flat glass, lead glass, tempered glass, ceramic glass, and the like, non-alkali glass substrates of aluminosilicate glass, aluminoborosilicate glass, barium borosilicate glass, and the like, and a quartz substrate can be used.

With the use of such a light-transmitting substrate as the first substrate 102, the light-emitting device 150 capable of emitting light from both surfaces can be manufactured; therefore, a light-emitting device with high added value and excellent design can be manufactured.

As the first substrate 102, any of a variety of plastic substrates formed of ethylene vinyl acetate (EVA), a polyethylene terephthalate resin (PET), a polyether sulfone resin (PES), a polyethylene naphthalate resin (PEN), a polyvinyl alcohol resin (PVA), a polycarbonate resin (PC), a polyethylene resin (PE), an ABS resin, and the like can also be used.

With the use of such a plastic substrate as the first substrate 102, the light-emitting device 150 can be reduced in thickness and weight, so that the light-emitting device can have higher added value.

Further, with the use of the above plastic substrate as the first substrate 102 and the second substrate 112, the flexible light-emitting device 150 can be formed, so that the light-emitting device can have higher added value.

Note that in the case where the above plastic substrate is used as the first substrate 102, a single layer or a stacked layer of a film having low water vapor permeability of silicon oxide, silicon nitride, silicon oxynitride, silicon nitride oxide, aluminum oxide, or the like is preferably formed on its surface. Thus, deterioration of the organic EL layer 108 can be suppressed because the plastic substrate has a high water vapor barrier property.

As the first electrode layer 104, for example, a single layer or a stacked layer of a metal material such as aluminum, gold, platinum, silver, nickel, tungsten, chromium, molybdenum, cobalt, copper, magnesium, titanium, or palladium or an alloy containing any of these materials can be used.

Since the first electrode layer 104 reflects light emitted from the organic EL layer 108 formed in a later step, the first electrode layer 104 preferably has reflectance of greater than or equal to 70%, more preferably greater than or equal to 90% with respect to a region with a wavelength of greater than or equal to 400 nm and less than or equal to 700 nm.

There is no particular limitation on the formation method of the first electrode layer 104, and a sputtering method, a resistance heating evaporation method, an electron beam evaporation method, ion plating, or the like can be employed depending on the material. Note that in the case where part of the first electrode layer 104, e.g., the periphery of an end portion of the substrate, is removed, a known method such as a dry etching method or a wet etching method may be employed.

Note that before the first electrode layer 104 is formed over the first substrate 102, a planarization layer may be formed over the first substrate 102. The planarization layer may be formed, for example, in such a manner that an organic resin such as an acrylic resin, a polyimide resin, a polyamide resin, a polyamide-imide resin, or an epoxy resin is formed over the first substrate 102 by a spin coating method, a printing method, an inkjet method, or the like, and then curing treatment is performed as appropriate. In the case where unevenness (specifically, a step with the greatest height Ry of 5 μm or more) is formed on a surface of the first substrate 102, variation in film thickness due to surface unevenness might be caused when the organic EL layer 108 is formed in a later step; therefore, a planarization film is especially effective in a substrate with an uneven surface.

In the case where a substrate having high conductivity such as a metal substrate is used as the first substrate 102, a planarization layer is preferably formed over the first substrate 102 because the first electrode layer 104 and the second electrode layer 109 which are formed in later steps are prevented from being electrically connected through the first substrate 102.

In addition, a base film may be formed before the first electrode layer 104 is formed over the first substrate 102. With the base film, deterioration of the organic EL layer 108 can be suppressed, and the reliability of the light-emitting device 150 can be increased. As the base film, for example, a single layer or a stacked layer of a film having low water vapor permeability of silicon oxide, silicon nitride, silicon oxynitride, silicon nitride oxide, aluminum oxide, or the like is preferably formed.

Figure 2B:
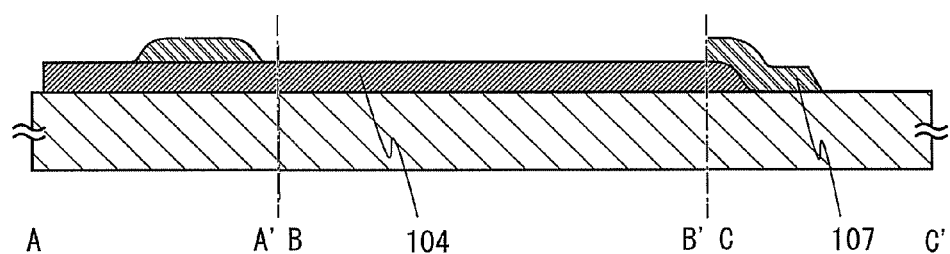

Next, the insulator 107 is formed over part of the first substrate 102 and the first electrode layer 104 (see FIG. 2B).

For the insulator 107, an organic resin such as an acrylic resin, a polyimide resin, a polyamide resin, a polyamide-imide resin, or an epoxy resin can be used, for example. Note that an angle between the insulator 107 and the first substrate 102 and an angle between the insulator 107 and the first electrode layer 104 are preferably less than or equal to 60°, more preferably less than or equal to 40°. Since the organic EL layer 108 is formed over the insulator 107 in a later step, disconnection when the organic EL layer 108 is formed can be suppressed with such a low angle.

In a part of an end portion of the first electrode layer 104 in FIG. 2A where the organic EL layer 108 and the second electrode layer 109 are formed in later steps (a circular portion of a dotted line which is represented by X in FIG. 2C), the organic EL layer 108 becomes thin and a short circuit between the organic EL layer 108 and the second electrode layer 109 is easily caused; therefore, the insulator 107 is preferably formed so as to cover the end portion.

As a formation method of the insulator 107, the above material is formed over the first substrate 102 by a spin coating method, a printing method, an inkjet method, or the like, and then heating, etching treatment, or the like is performed depending on the material as appropriate. Note that in the case where the above plastic substrate is used as the first substrate 102, curing treatment is necessarily performed under the condition that the first substrate 102 is not deformed (that is, at a temperature of lower than the strain point of the substrate).

Figure 2C:
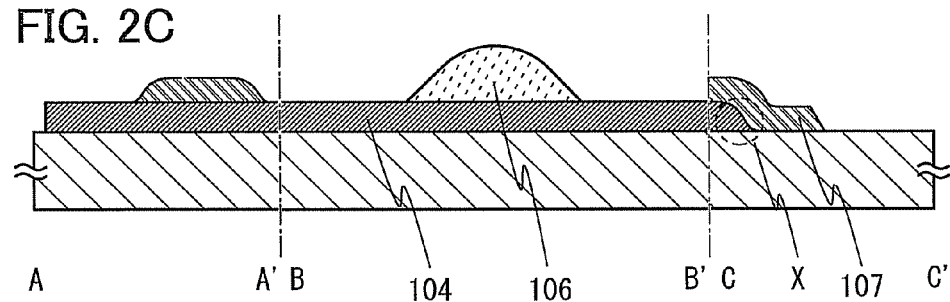

Next, the structure body 106 is formed over the first electrode layer 104 (see FIG. 2C).

For the structure body 106, for example, an organic resin such as an acrylic resin, a polyimide resin, a polyamide resin, a polyamide-imide resin, or an epoxy resin can be used. Note that an angle between the structure body 106 and the first electrode layer 104 is preferably less than or equal to 60°, more preferably less than or equal to 40°. Since the organic EL layer 108 is Banned over the structure body 106 in a later step, disconnection when the organic EL layer 108 is foamed can be suppressed by setting the structure body 106 to such a low angle.

Note that the thickness of the structure body 106 is necessarily larger than that of the insulator 107. In particular, a thickness of 5 μm or more is preferable and a thickness of 10 μm or more is more preferable.

As a formation method of the structure body 106, the above material is formed over the first substrate 102 by a printing method, an inkjet method, or the like, and then curing treatment such as heating is performed depending on the material as appropriate. Note that in the case where the above plastic substrate is used as the first substrate 102, curing treatment is necessarily performed under the condition that the first substrate 102 is not deformed (that is, at a temperature of lower than the strain point of the substrate).

Figure 4A:
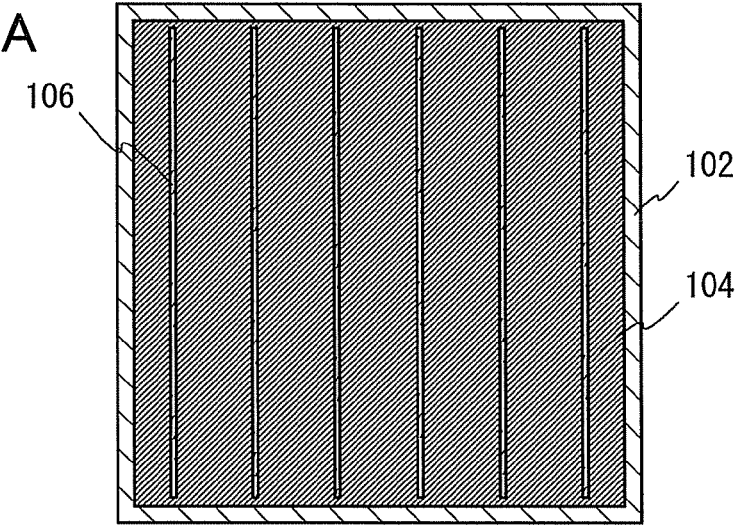
FIGS. 4A to 4C each illustrate the method for manufacturing the light-emitting device described in Embodiment 1.
Figure 4B:
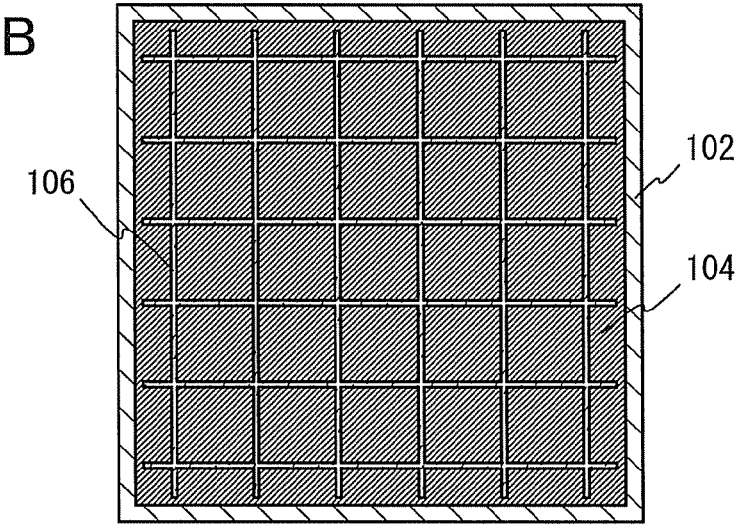
Figure 4C:
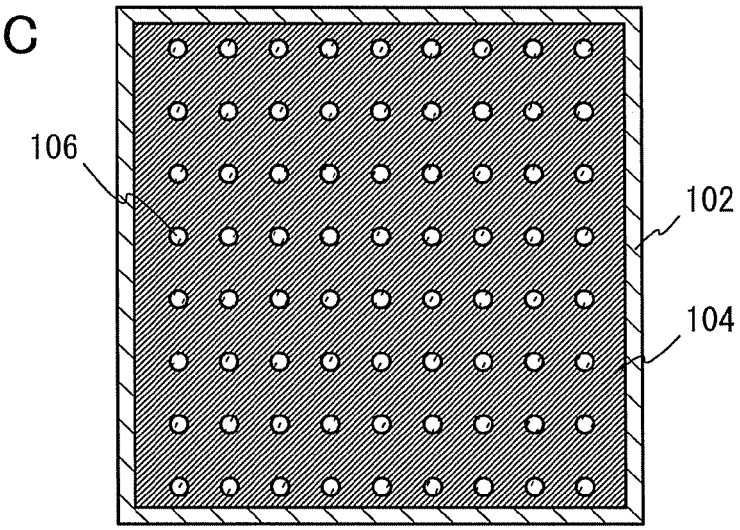

By forming the structure body 106 linearly as illustrated in FIG. 4A, the second electrode layer 109 is in contact with the conductive layer 114 linearly when the base substrate 110 and the sealing substrate 120 are bonded to each other in a later step. Thus, variation in resistance value in a plane of the second electrode layer 109 can be reduced, so that variation in light emission can be reduced when the organic EL layer 108 emits light. Further, the structure body 106 may be formed in a grid as illustrated in FIG. 4B or in an island-like shape as illustrated in FIG. 4C. In a formation layout of the structure body, it is important that non-uniformity on a substrate plane (e.g., the structure bodies 106 are provided only on the right side of the first substrate 102) is reduced. Thus, variation in resistance value in a plane can be effectively reduced and high effect of suppressing variation in light emission can be obtained.

Figure 2D:
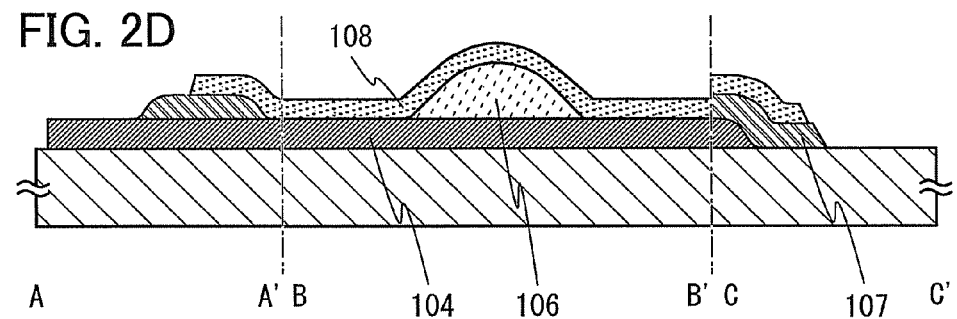

Next, the organic EL layer 108 is formed over the first electrode layer 104, the structure body 106, and the insulator 107 (see FIG. 2D).

For a light-emitting layer, a hole-injection layer, a hole-transport layer, an electron-injection layer, and an electron-transport layer forming the organic EL layer 108, a known organic material may be used, and a material may be selected depending on usage of the light-emitting device as appropriate. For example, in the case where the light-emitting device is used for indoor lighting such as an incandescent lamp or a fluorescent lamp, the organic EL layer 108 may have a three-layer structure in which light of red (R), green (G), and blue (B) are emitted to exhibit light emission of white color, e.g., daylight color or day white color, and each layer is formed with fine adjustment so that emission color is adjusted. Alternatively, layers which emit light of complementary colors may be stacked, and each layer is faulted with fine adjustment so that emission color is adjusted. Needless to say, the structure of the organic EL layer 108 is not limited thereto.

As a formation method of the organic EL layer 108, for example, a vacuum evaporation method such as a resistive heating evaporation method or an electron-beam evaporation method can be employed. Since the organic EL layer 108 is greatly deteriorated by water, oxygen, or the like in the air, the organic EL layer 108 is preferably formed so as to be provided more on the inside than the sealant 130 formed in a later step (a side which is closer to the center portion of the substrate than to the sealant 130). In order to form the organic EL layer 108 in a predetermined position as described above, a metal mask or the like is used, for example.

Next, the second electrode layer 109 is formed over the first substrate 102, the insulator 107, and the organic EL layer 108 (see FIG. 3A).

For the second electrode layer 109, for example, a conductive metal oxide film of indium tin oxide, indium tin oxide containing silicon, indium oxide containing zinc or tungsten, or the like is preferably used. These materials have high transmittance in a visible light region and transmit light emitted from the organic EL layer 108 at a high rate.

The second electrode layer 109 may be formed by a sputtering method, an ion plating method, a vacuum evaporation method, a cluster beam evaporation method, a laser evaporation method, or the like. Note that it needs to be formed in a temperature range that the organic EL layer 108 is not damaged. In the case where the second electrode layer 109 is formed by a sputtering method, it is preferable that damage to the organic EL layer 108 be reduced by a facing target sputtering method (also referred to as a mirrortron sputtering method) or the like.

Note that after the second electrode layer 109 is formed, a protective film covering the second electrode layer 109 may be formed. With the protective film, deterioration of the organic EL layer 108 can be suppressed and the reliability of the light-emitting device 150 can be increased. As the protective film, for example, a single layer or a stacked layer of a film having low water vapor permeability of silicon oxide, silicon nitride, silicon oxynitride, silicon nitride oxide, aluminum oxide, or the like is preferably formed.

Through the above steps, the base substrate 110 is formed in which the first electrode layer 104, the structure body 106, the insulator 107, the organic EL layer 108, and the second electrode layer 109 are formed over the first substrate 102.

Note that when a substrate in which unevenness is formed on a surface different from a surface on which the structure body 106 is formed or a substrate with unevenness is used as the first substrate 102, the uneven portion serves as a heat sink; therefore, heat from the organic EL layer 108 can be more efficiently released to the outside. Note that a known technique can be used and there is no particular limitation to a method for forming unevenness. For example, knife processing, water-jet processing, microblast processing, laser processing, or the like can be used.

Next, the conductive layer 114 is formed over the second substrate 112, so that the sealing substrate 120 is formed (see FIG. 3B).

As the second substrate 112, for example, any of a variety of glass substrates formed of general flat glass, clear flat glass, lead glass, tempered glass, ceramic grass, and the like, non-alkali glass substrates of aluminosilicate glass, aluminoborosilicate glass, barium borosilicate glass, and the like, and a quartz substrate can be used. In the present invention, light from the organic EL layer 108 is emitted to the second substrate 112 side; therefore, the second substrate 112 preferably has transmittance of greater than or equal to 70%, more preferably greater than or equal to 85% with respect to a region with a wavelength of greater than or equal to 400 nm and less than or equal to 700 nm.

As the second substrate 112, any of a variety of plastic substrates formed of ethylene vinyl acetate (EVA), a polyethylene terephthalate resin (PET), a polyether sulfone resin (PES), a polyethylene naphthalate resin (PEN), a polyvinyl alcohol resin (PVA), a polycarbonate resin (PC), a polyethylene resin (PE), an ABS resin, and the like can also be used.

With the use of such a plastic substrate as the second substrate 112, the light-emitting device 150 can be reduced in thickness and weight, so that the light-emitting device can have higher added value.

Note that in the case where the above plastic substrate is used as the second substrate 112, a single layer or a stacked layer of a film having low water vapor ineability of silicon oxide, silicon nitride, silicon oxynitride, silicon nitride oxide, aluminum oxide, or the like is preferably formed on its surface. Thus, deterioration of the organic EL layer 108 can be suppressed because the plastic substrate has a high water vapor barrier property, so that the reliability of the light-emitting device 150 can be increased.

The conductive layer 114 may be formed, for example, in such a manner that a solvent, a resin material, or the like including minute metal wirings of gold, silver, copper, tin, aluminum, nickel, cobalt, or an alloy thereof is coated over the second substrate 112 by a spin coating method, a printing method, a dispensing method, an inkjet method, or the like and baked (a baking step is not necessarily performed depending on the kind of a solution).

As an example of the minute metal wiring, a metal wiring whose diameter is a nanometer size (specifically, smaller than or equal to 100 nm), called a nanowire, can be given. When a material including minute metal wirings is formed by the above method, the minute metal wirings are widely provided in a planar manner and are partly overlapped with each other, so that the conductive layer 114 in which high conductivity is ensured on the whole surface can be obtained. Further, since the size of the minute metal wiring itself is extremely narrow and small as described above, the conductive layer 114 to be formed has high visible light transmittance.

Since light from the organic EL layer 108 is emitted to the second electrode layer 109 side, the conductive layer 114 needs to have a high visible light transmitting property. Specifically, the conductive layer 114 preferably has transmittance of greater than or equal to 60%, more preferably greater than or equal to 80% with respect to a region with a wavelength of greater than or equal to 400 nm and less than or equal to 700 nm. In order to form the conductive layer 114 having such high transmittance, the content percentage of minute metal wirings in the solvent or the resin material is less than or equal to 40 vol %, preferably less than or equal to 20 vol %.

As described above, with the use of the conductive layer 114 having high visible light transmittance, the loss of light emitted from the organic EL layer 108 due to reflection and absorption at the conductive layer 114 is reduced; therefore, the light is efficiently emitted to the outside.

In addition to the above materials, a thin metal film formed using a single layer or a stacked layer of one or more of gold, platinum, silver, copper, aluminum, titanium, nickel, cobalt, chromium, tungsten, molybdenum, and an alloy material containing the above metal material as its main component (for example, an alloy in which beryllium, rhodium, neodymium, indium, zirconium, manganese, iron, silicon, or the like is mixed into the above metal material) may be used for the conductive layer 114. In the case where a thin metal film used as the conductive layer 114, the conductive layer 114 preferably has a thin film thickness so as to have transmittance of greater than or equal to 60%, more preferably greater than or equal to 80% with respect to a region with a wavelength of greater than or equal to 400 nm and less than or equal to 700 nm.

In addition, the conductive layer 114 needs to have low resistivity because it reduces the resistance of the second electrode layer 109 by being in contact with part of the second electrode layer 109 in a later step. Specifically, the resistivity is preferably less than or equal to $3 \times 10^{-4}$ $\Omega \cdot m$, more preferably less than or equal to $1 \times 10^{-4}$ $\Omega \cdot m$, still more preferably less than or equal to $5 \times 10^{-5}$ $\Omega \cdot m$.

In such a manner, by forming the conductive layer 114 having low resistivity on the second substrate 112 side, the conductive layer 114 can be formed without considering adverse influence of etching treatment or heat treatment performed on the organic EL layer 108. Thus, as compared to the case where the conductive layer 114 is formed on the first substrate 102 side (in other words, the conductive layer 114 is formed in contact with the second electrode layer 109), reduction in processing time and improvement in yield can be expected as well as the high-quality conductive layer 114 with low resistivity can be formed.

Note that in FIG. 1B, the conductive layer 114 is formed only more on the inside than the sealant 130; however, the conductive layer 114 may be connected to the outside of the sealant 130.

Through the above steps, the sealing substrate 120 including the conductive layer 114 over the second substrate 112 is formed.

Next, over the base substrate 110, the sealant 130 is formed closer to the end portion of the substrate than to the region where the organic EL layer 108 is formed so as to surround the organic EL layer 108 (see FIG. 3C). Although the sealant 130 is formed over the base substrate 110 in this embodiment, the sealant 130 may be formed over the sealing substrate 120 or the sealant 130 may be formed over the base substrate 110 and the sealing substrate 120. In addition, the number of sealants 130 surrounding the organic EL layer 108 is one in this embodiment; however, the number thereof may be plural. By formation of a plurality of sealants 130, entry of moisture and oxygen from the outside can be effectively suppressed, whereby a light-emitting element having a long lifetime can be manufactured.

As the sealant 130, any of a variety of curable adhesives, for example, a photo-curable adhesive such as a UV curable adhesive, a reactive curable adhesive, a thermosetting adhesive, and an anaerobic adhesive may be used. In view of productivity and the influence on various materials used for the light-emitting device 150, a photo-curable adhesive which does not need cure treatment under a high temperature condition and is cured in a short time, is preferably used. Further, the sealant 130 may include a spacer material.

The sealant 130 may be formed, for example, by a printing method using any of a variety of printing machines such as a flexible printing machine, an offset printing machine, a gravure printing machine, a screen printing machine, an inkjet machine, and a dispenser.

Next, a surface of the base substrate 110 where the second electrode layer 109 is formed and a surface of the sealing substrate 120 where the conductive layer 114 is formed are bonded to face each other, and then optimal curing treatment is performed on the sealant 130 depending on the material to be used, so that the organic EL layer 108 is sealed (see FIG. 3D).

Note that the above sealing treatment is preferably performed under reduced pressure or in an inert gas atmosphere of nitrogen or the like. Thus, a space surrounded by the base substrate 110, the sealing substrate 120, and the sealant 130 becomes under reduced pressure or is filled with an inert gas, so that deterioration of the organic EL layer 108 can be suppressed.

Through the above steps, the light-emitting device 150 having a top-emission structure according to one embodiment of the disclosed invention can be formed.

<Effect of Light-Emitting Device in this Embodiment

In the light-emitting device 150 having a top-emission structure formed through the above steps, the second electrode layer 109 and the conductive layer 114 are in contact with each other in a Y portion (a circular portion of a dotted line) in FIG. 3D. Therefore, in the case where an external power source (not illustrated) is connected to the first electrode layer 104 and the second electrode layer 109 and current flows, the current also flows into the conductive layer 114 through the Y portion and the conductive layer 114 serves as an auxiliary wiring. Accordingly, power consumption of the light-emitting device 150 can be reduced.

Note that the shape of the Y portion can be freely changed by a change of the layout of the structure body 106 formed over the first substrate 102 as illustrated in FIGS. 4A to 4C. For example, when the structure body 106 is provided as illustrated in FIG. 4B, the second electrode layer 109 and the conductive layer 114 are in contact with each other in a grid, so that variation in resistance value in the substrate plane can be reduced. Accordingly, variation in light emission of the light-emitting device 150 can be suppressed.

Since heat from light emitted from the organic EL layer 108 is conducted to the first substrate 102 through the first electrode layer 104 and the structure body 106, heat from light emitted from the organic EL layer 108 can be efficiently released to the outside with the use of a substrate having high thermal conductivity as the first substrate 102. Thus, deterioration of the organic EL layer 108 due to heat is suppressed and the light-emitting device 150 can have a long lifetime.

(Embodiment 2)

In this embodiment, a structure which is different from the structure of the light-emitting device manufactured in Embodiment 1 in the position at which the structure body 106 is formed is described with reference to FIGS. 5A and 5B and FIGS. 6A to 6C. In the structure of this embodiment described below, the same portions or portions having similar functions are denoted by the same reference numerals in different drawings, in Embodiment 1, and the description thereof is not repeated.

<Structure of Light-Emitting Device in this Embodiment>

Figure 5A:
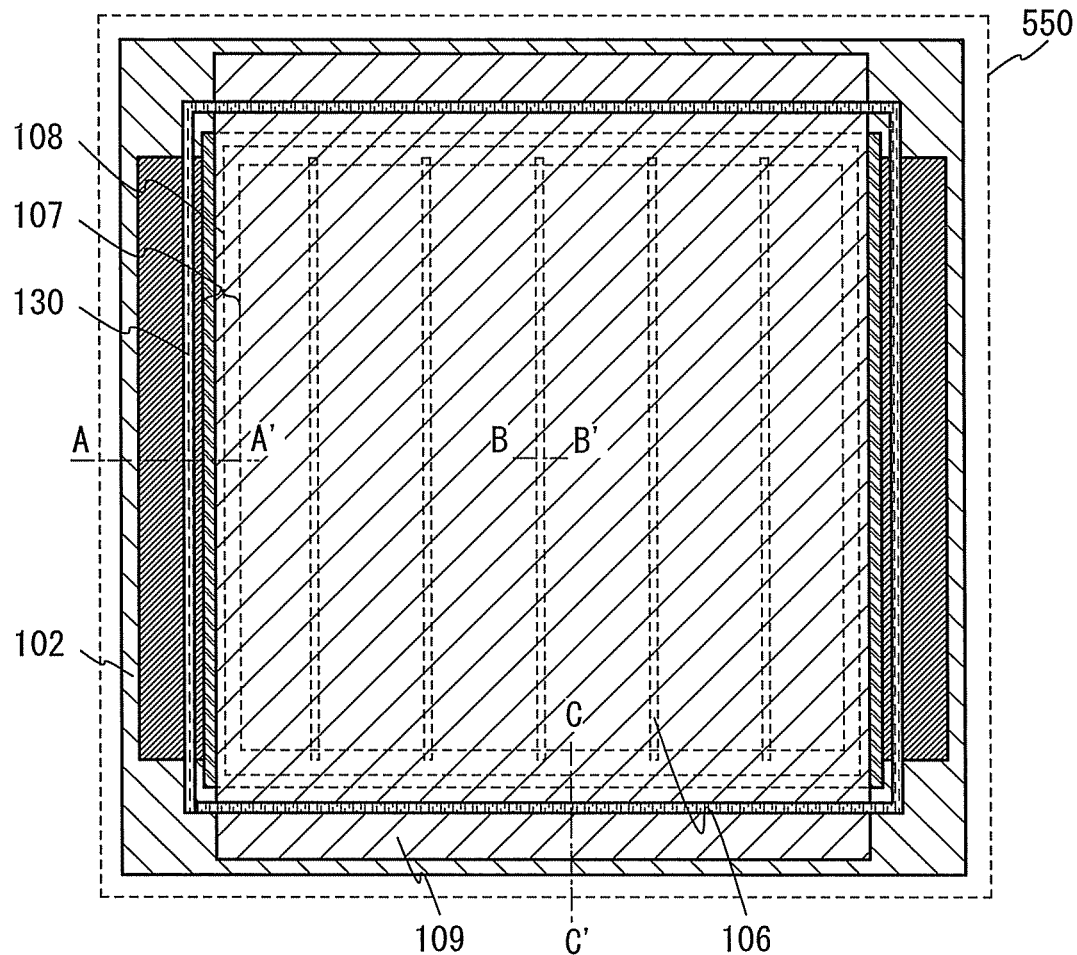
FIGS. 5A and 5B illustrate a structure of a light-emitting device described in Embodiment 2.
Figure 5B:
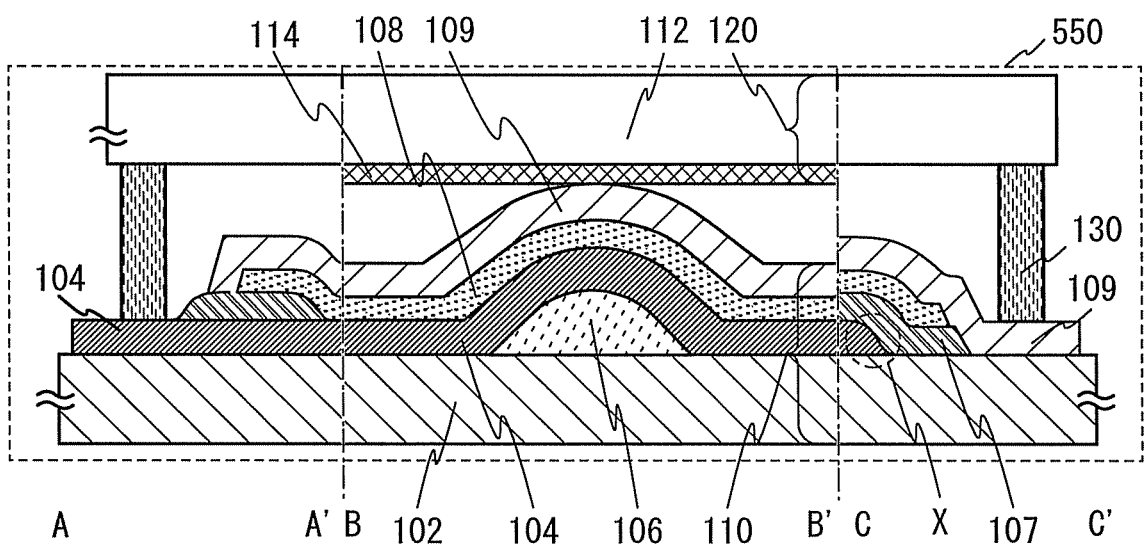

FIGS. 5A and 5B are diagrams illustrating an example of a structure of a light-emitting device manufactured by a method in this embodiment. FIG. 5A is a schematic top view of a light-emitting device 550 and FIG. 5B is a schematic cross-sectional view taken along dashed-dotted lines A-N, B-B', and C-C' in FIG. 5A. Note that the second substrate 112 and the conductive layer 114 are not illustrated in FIG. 5A for simplicity.

The light-emitting device 550 in FIGS. 5A and 5B includes the base substrate 110 including the first substrate 102, the structure body 106 formed over the first substrate 102, the first electrode layer 104 formed over the first substrate 102 and the structure body 106, the organic EL layer 108 formed over the first electrode layer 104, and the second electrode layer 109 formed over the organic EL layer 108, and the sealing substrate 120 including the second substrate 112 and the conductive layer 114 formed over the second substrate 112. The base substrate 110 and the sealing substrate 120 are bonded to each other with the sealant 130.

<Method for Manufacturing Light-Emitting Device in this Embodiment>

A method for manufacturing the light-emitting device 550 is described below with reference to FIGS. 6A to 6C.

Figure 6A:
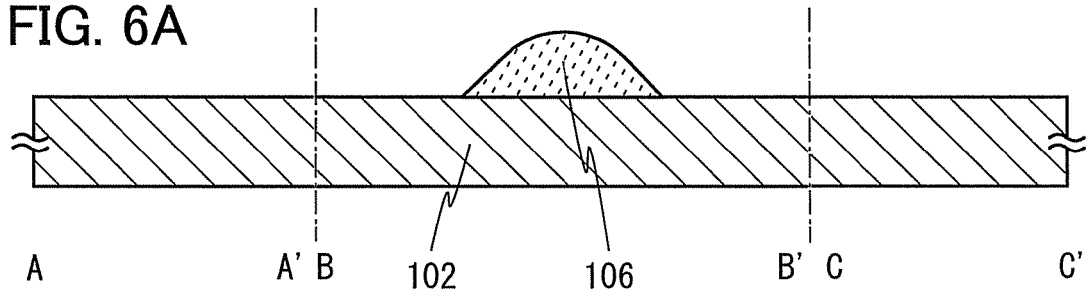
FIGS. 6A to 6C illustrate a method for manufacturing the light-emitting device described in Embodiment 2.

First, the structure body 106 is formed over the first substrate 102 (see FIG. 6A).

The materials, formation methods, and features of the first substrate 102 and the structure body 106 are similar to those in Embodiment 1; therefore, the description is omitted here.

Figure 6B:
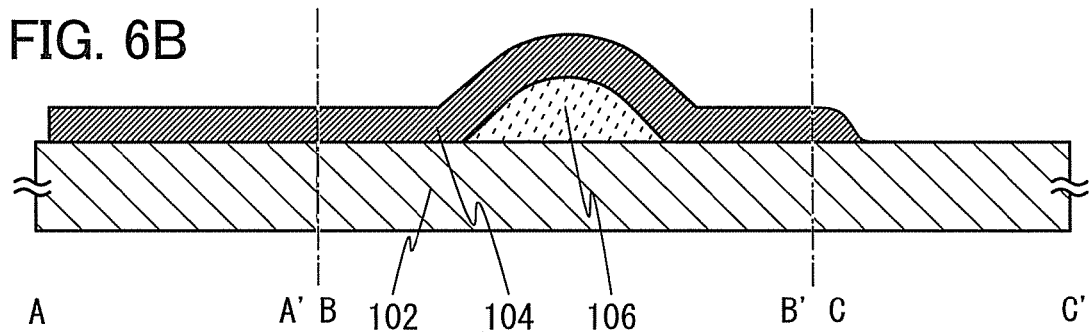
Figure 6C:
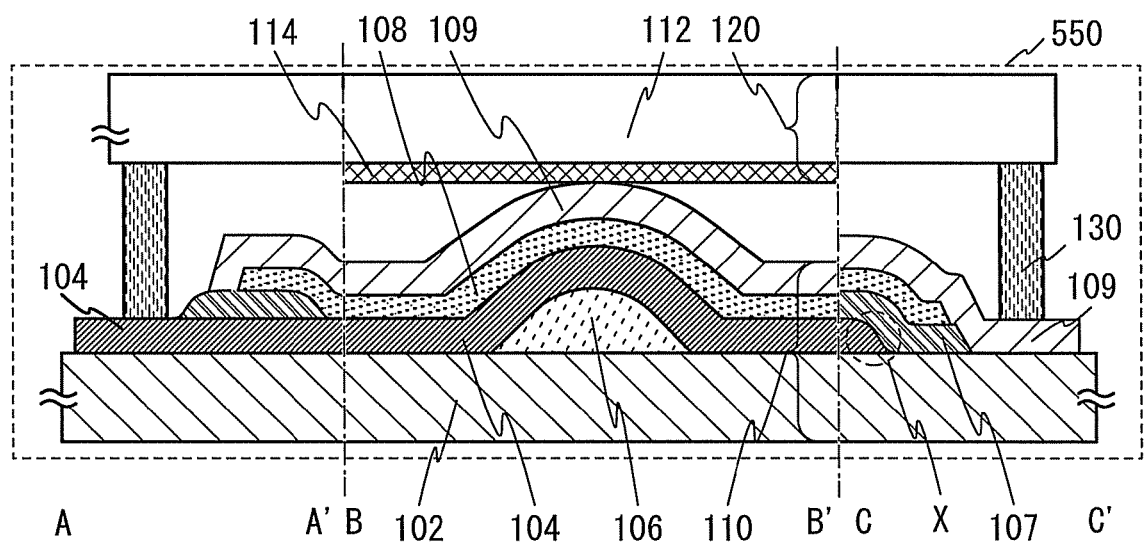

Next, the first electrode layer 104 is formed over the first substrate 102 and the structure body 106 (see FIG. 6B).

The material, formation method, and features of the first electrode layer 104 are similar to those in Embodiment 1; therefore, the description is omitted here.

In the subsequent steps, similarly to those in Embodiment 1, the insulator 107 is formed over the first substrate 102 and the first electrode layer 104, the organic EL layer 108 is formed over the first electrode layer 104 and the insulator 107, and the second electrode layer 109 is formed over the first substrate 102, the insulator 107, and the organic EL layer 108, so that the base substrate 110 is manufactured. The sealing substrate 120 is formed by forming the conductive layer 114 over the second substrate 112. The base substrate 110 and the sealing substrate 120 are sealed with the sealant 130, whereby the light-emitting device 550 having a top-emission structure according to one embodiment of the invention disclosed herein can be formed (see FIG. 6C).

Note that since the detailed description of the component elements is similar to that in Embodiment 1, the description is omitted here.

<Effect of Light-Emitting Device in this Embodiment>

In the light-emitting device 550 having a top-emission structure formed through the above steps, power consumption is reduced, variation in light emission is suppressed, and deterioration of the organic EL layer 108 due to heat is suppressed, similarly to the light-emitting device 150 described in Embodiment 1. Since the structure body 106 is formed below the first electrode layer 104, light emission area of the organic EL layer 108 is larger than that in the light-emitting device, 150. Therefore, the light-emitting device 550 can have lower power consumption than the light-emitting device 150. In addition, since the structure body 106 is covered with the first electrode layer 104 and the organic EL layer 108 is formed thereover, even when impurities (e.g., moisture) which deteriorate the organic EL layer 108 are contained in the structure body 106, entry of the impurities to the organic EL layer 108 can be prevented by the first electrode layer 104. Thus, a light-emitting device which has less deterioration in luminance and high reliability for a long time can be provided.

(Embodiment 3)

In this embodiment, a structure which is different from the structure of the light-emitting device manufactured in Embodiment 1 in the shape of the structure body 106 is described with reference to FIGS. 7A and 7B, FIGS. 8A to 8D, and FIGS. 9A and 9B. In the structure of this embodiment described below, the same portions or portions having similar functions are denoted by the same reference numerals in different drawings, in Embodiment 1, and the description thereof is not repeated.

<Structure of Light-Emitting Device in this Embodiment>

Figure 7A:
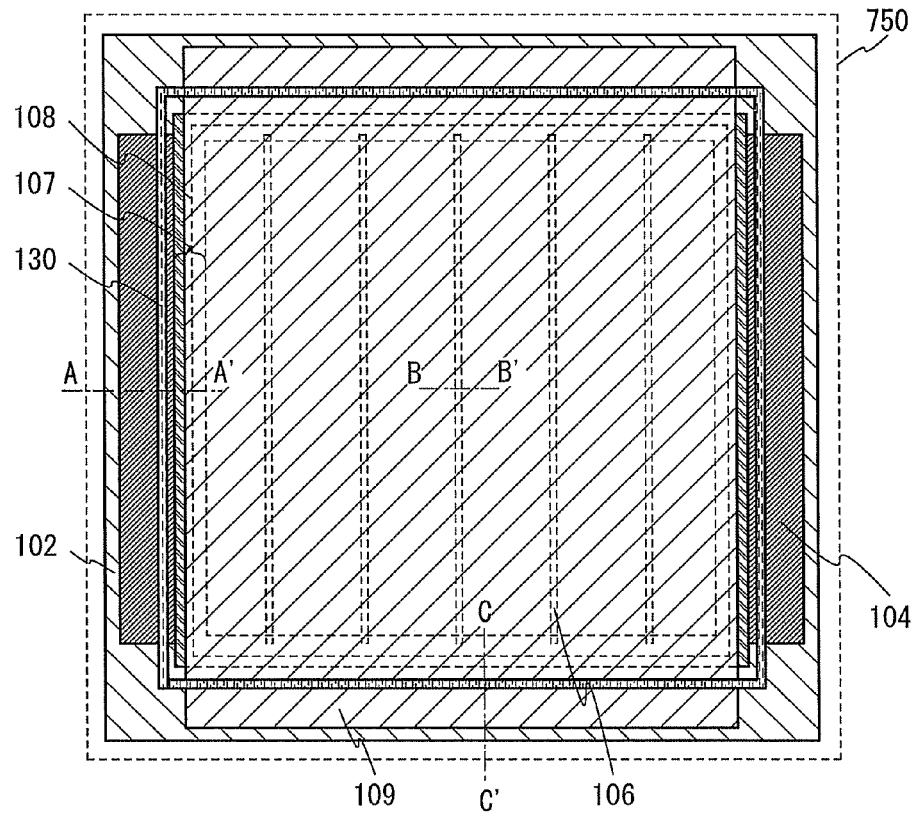
FIGS. 7A and 7B illustrate a structure of a light-emitting device described in Embodiment 3.
Figure 7B:
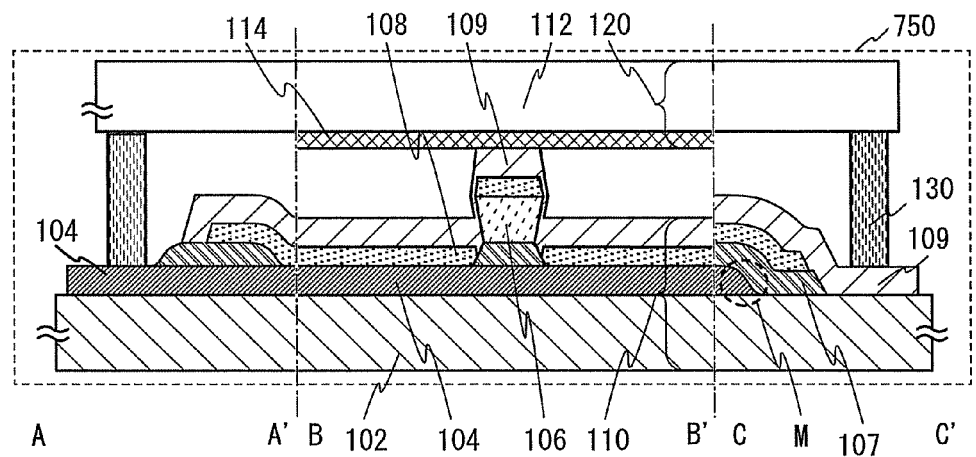

FIGS. 7A and 7B are diagrams illustrating an example of a structure of a light-emitting device manufactured by a method in this embodiment. FIG. 7A is a schematic top view of a light-emitting device 750 and FIG. 7B is a schematic cross-sectional view taken along dashed-dotted lines A-A', B-B', and C-C' in FIG. 7A. Note that the EL layer 108 and the second electrode layer 109 are not illustrated in FIG. 7A for simplicity.

The light-emitting device 750 in FIGS. 7A and 7B includes the base substrate 110 including the first substrate 102, the first electrode layer 104, the insulator 107, the structure body 106, the organic EL layer 108, and the second electrode layer 109, and the sealing substrate 120 including the second substrate 112 and the conductive layer 114.

The structure body 106 is formed using an insulating material and is formed over part of the insulator 107. The structure body 106 in this embodiment has a shape in which an upper portion is wide. In other words, the structure body 106 is formed so that a contact surface with the insulator 107 which is the bottom surface of the structure body 106 is smaller than a contact surface with the organic EL layer 108 which is the top surface of the structure body 106 and the bottom surface is hidden in the top surface when seen from the above.

By providing the structure body 106 having such a shape, the organic EL layer 108 to be formed by a method described later is divided by the structure body 106.

The organic EL layer 108 taken along line B-B' in FIG. 7B is electrically divided by the structure body 106. The second electrode layer 109 is electrically connected to the structure body 106 because the second electrode layer 109 is formed on a sidewall portion of the structure body 106 to be thin.

<Method for Manufacturing Light-Emitting Device in this Embodiment>

A method for manufacturing the light-emitting device 750 is described below with reference to FIGS. 8A to 8D and FIGS. 9A and 9B.

Figure 8A:
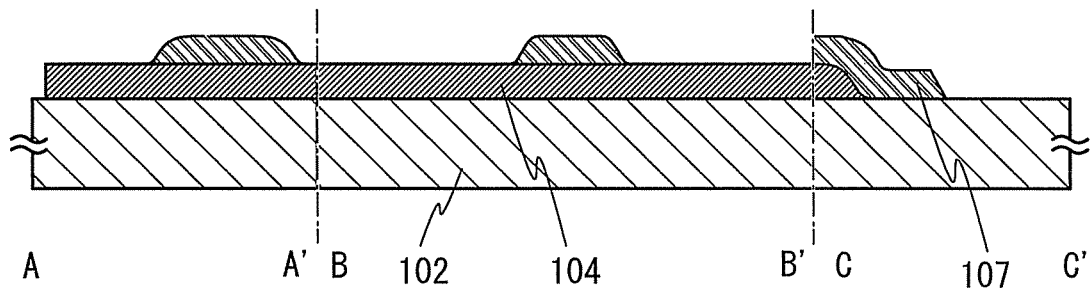
FIGS. 8A to 8D illustrate a method for manufacturing the light-emitting device described in Embodiment 3.

First, the first electrode layer 104 is formed over the first substrate 102, and then the insulator 107 is formed over parts of the first substrate 102 and the first electrode layer 104 (see FIG. 8A).

The materials, formation methods, and features of the first substrate 102, the first electrode layer 104, and the insulator 107 are similar to those in Embodiment 1; therefore, the description is omitted here.

Figure 8B:
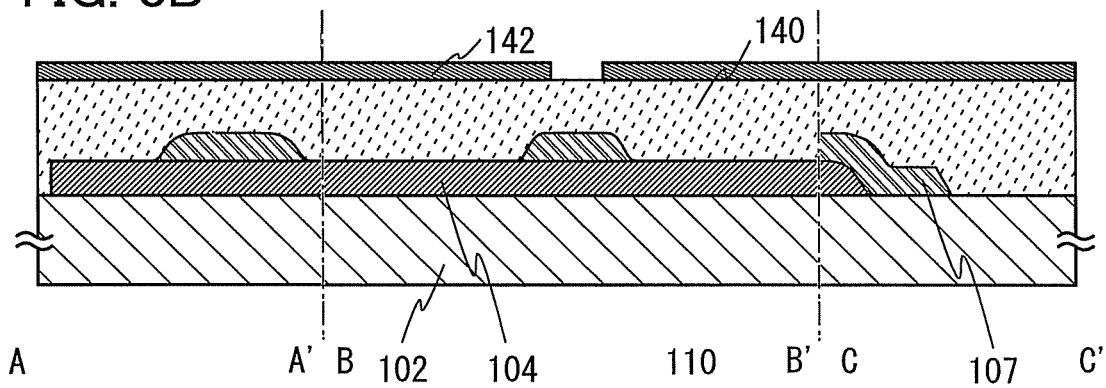

Next, an insulating material 140 is formed over the first substrate 102, the first electrode layer 104, and the insulator 107, and then a resist mask 142 is formed over part of the insulating material 140 (see FIG. 8B).

As the insulating material 140, for example, an organic resin such as an acrylic resin, a polyimide resin, a polyamide resin, a polyamide-imide resin, or an epoxy resin can be used. Alternatively, a so-called coated silicon oxide film (spin on glass, hereinafter referred to as an "SOG" film) in which an inorganic film is formed by heat treatment after coating, a siloxane polymer in which a siloxane bond is formed by heat treatment, or the like may be used.

As a formation method of the insulating material 140, the above material is formed over the first substrate 102, the first electrode layer 104, and the insulator 107 by a spin coating method, a printing method, an inkjet method, or the like, and then curing treatment such as heating is performed depending on the material as appropriate. Note that in the case where the above plastic substrate is used as the first substrate 102, curing treatment is necessarily performed under the condition that the first substrate 102 is not deformed.

There is no particular limitation on a material used for the resist mask 142, and a commercial resist material or the like may be used as appropriate depending on the kind of a solvent used in etching treatment performed in a later step.

A photolithography method using a photomask or a droplet discharging method may be used as a formation method of the resist mask 142. When a droplet discharging method is used, the resist mask can be directly formed without providing a photomask, and thus, the number of steps can be reduced. Note that the droplet discharging method is a method in which a composition including a formation material of an object which is fluid is discharged (jetted) as a droplet to form a pattern with a desired shape. A droplet containing the formation material of the object is discharged to a component formation region, and the composition is fixed by baking, drying, and the like to form a component having a desired pattern.

Figure 8C:
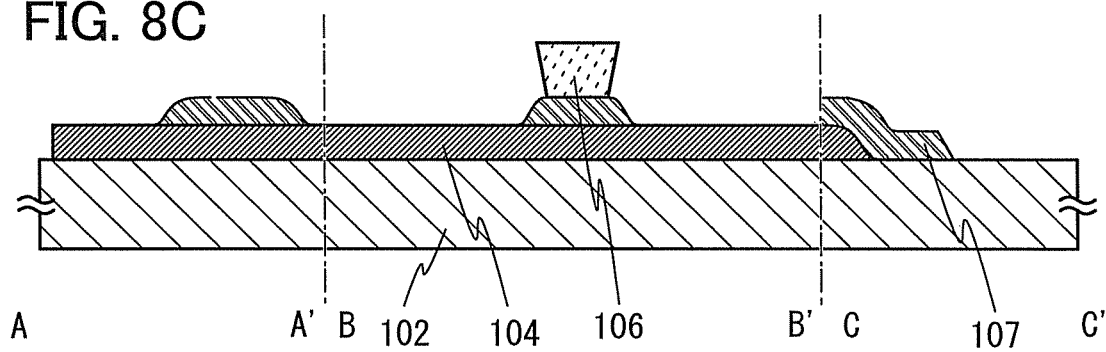

Next, etching treatment is performed on the insulating material 140 to form the structure body 106, and then the resist mask 142 is removed (see FIG. 8C).

In order to etch the insulating material 140 into an inverse tapered shape as illustrated in FIG. 8C, for example, with the use of an organic resin with a negative photosensitivity as the insulating material 140, light exposure is performed so that the intensity of light becomes lower toward the first substrate 102 in the film thickness direction, and then development is performed.

Figure 10A:
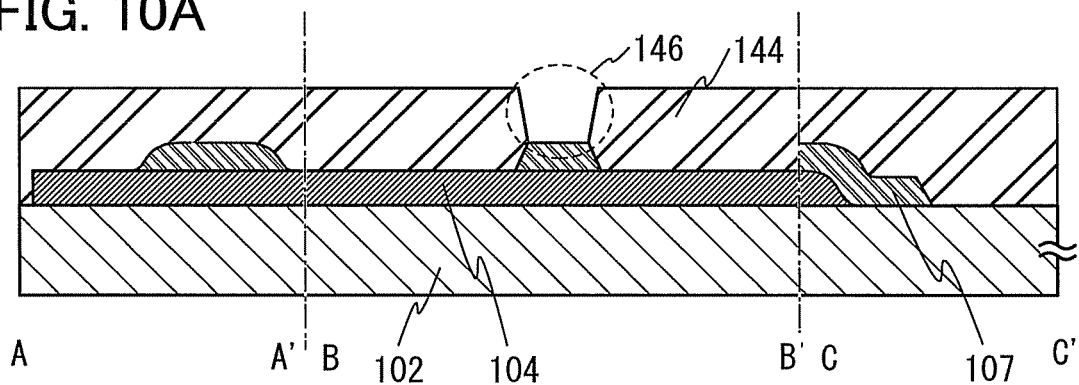
FIGS. 10A to 10C illustrate the method for manufacturing the light-emitting device described in Embodiment 3.
Figure 10B:
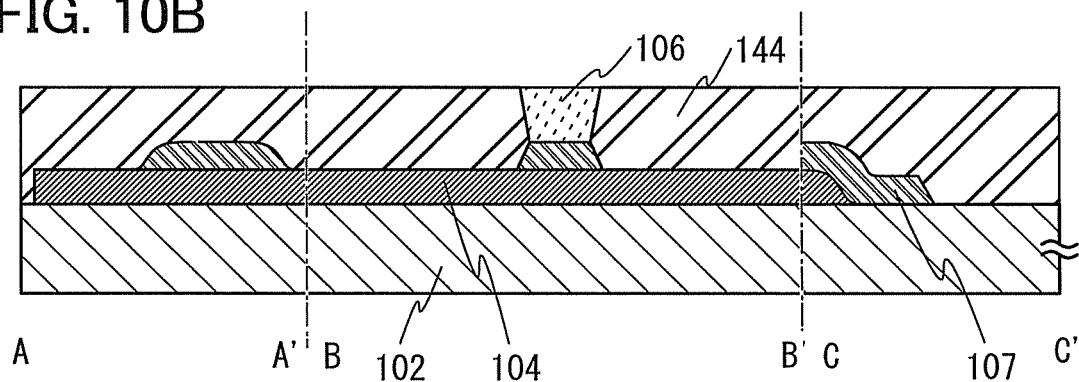
Figure 10C:
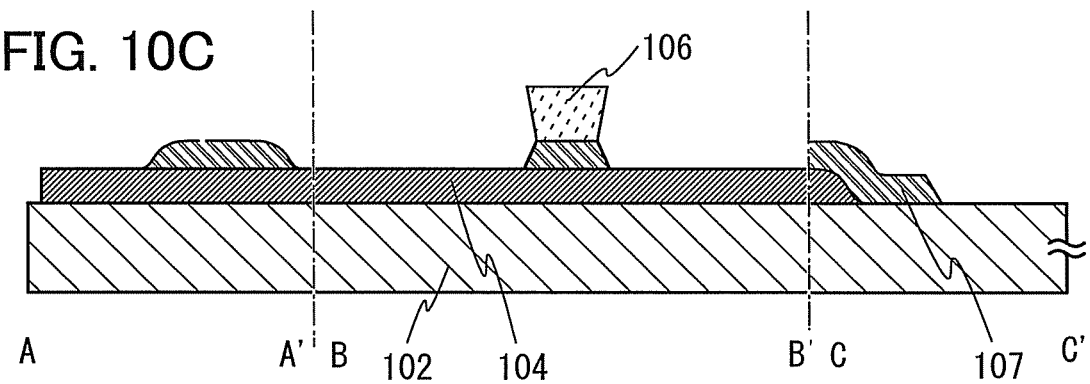

As another formation method, the following method illustrated in FIGS. 10A to 10C can be given, for example: a sacrifice layer 144 is formed over the first substrate 102, the first electrode layer 104, and the insulator 107 and partly removed, an opening 146 for forming the structure body 106 is formed (see FIG. 10A), the structure body 106 is formed in the opening 146 (see FIG. 10B), and the sacrifice layer 144 is removed, so that the structure body 106 is exposed (see FIG. 10C). The sacrifice layer 144 may be formed, for example, by using aluminum and dissolving the aluminum by a mixed solution of acetic acid, nitric acid, and phosphoric acid after the structure body 106 is formed. With the use of a material having high tolerance with respect to the above mixed solution (e.g., polyimide) as a formation material of the structure body 106, the structure body 106 having an inverse tapered shape can be formed as illustrated in FIG. 10C.

Figure 8D:
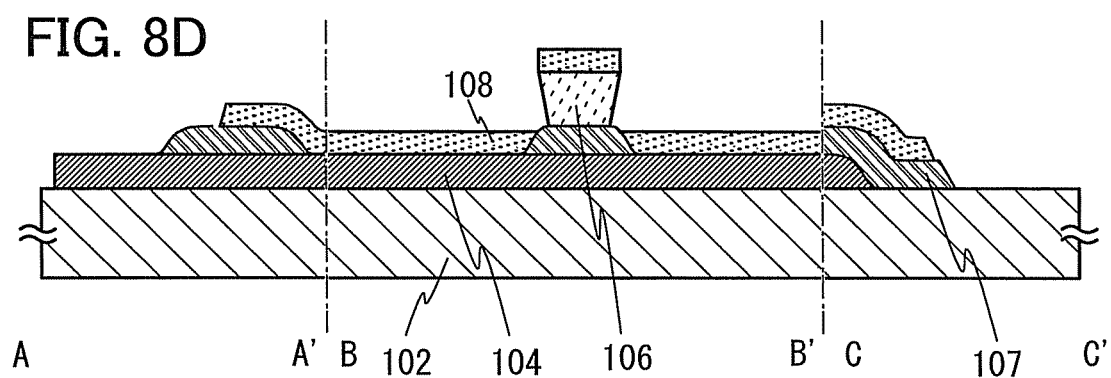

Next, the organic EL layer 108 is formed over the first electrode layer 104, the structure body 106, and the insulator 107 (see FIG. 8D). The material and formation method of the organic EL layer 108 are similar to those in Embodiment 1; therefore, the description is omitted.

The organic EL layer 108 may be formed by a vacuum evaporation method as described in Embodiment 1. By a vacuum evaporation method, deposition is not sufficient (also expressed that entrance is poor), and the organic EL layer 108 is easily formed on a surface of the first electrode layer 104 and over the structure body 106; however, the organic EL layer 108 is hardly formed on side surfaces of the structure body 106. Therefore, as illustrated in FIG. 8D, film disconnection occurs in the organic EL layer 108 at an end portion of the structure body 106 when the organic EL layer 108 is formed. In particular, when the side surfaces of the structure body 106 have an inverse tapered shape as in this embodiment, film disconnection more easily Occurs.

Figure 9A:
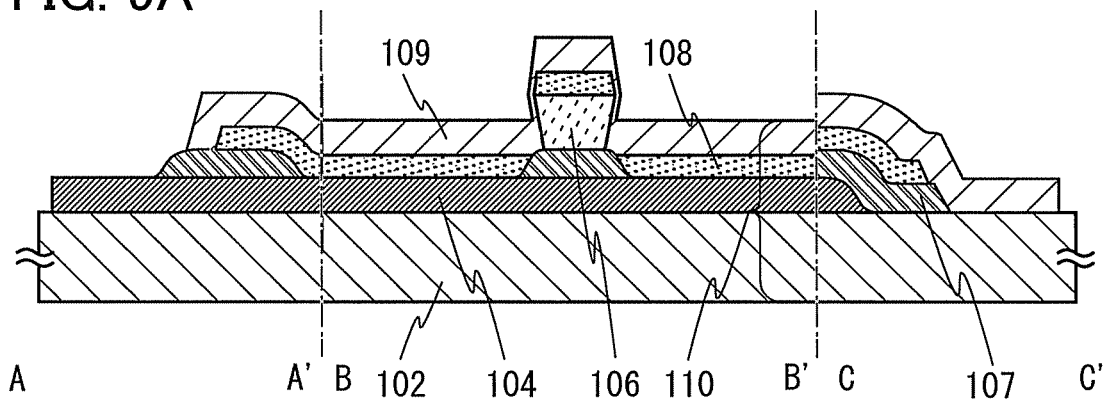
FIGS. 9A and 9B illustrate the method for manufacturing the light-emitting device described in Embodiment 3.

Next, the second electrode layer 109 is formed over the first substrate 102, the insulator 107, and the organic EL layer 108 (see FIG. 9A). The material and formation method of the second electrode layer 109 are similar to those in Embodiment 1; therefore, the description is omitted.

Since deposition to a tapered portion is easily performed by a physical vapor deposition method such as a sputtering method which is employed as the formation method of the second electrode layer 109 or an ion plating method (what is called, deposition is sufficient), the second electrode layer 109 is formed also on the side surfaces of the structure body 106 as illustrated in FIG. 9A. Thus, all formation surfaces of the second electrode layer 109 are electrically connected to each other.

Through the above steps, the base substrate 110 is formed in which the first electrode layer 104, the structure body 106, the insulator 107, the organic EL layer 108, and the second electrode layer 109 are formed over the first substrate 102.

Figure 9B:
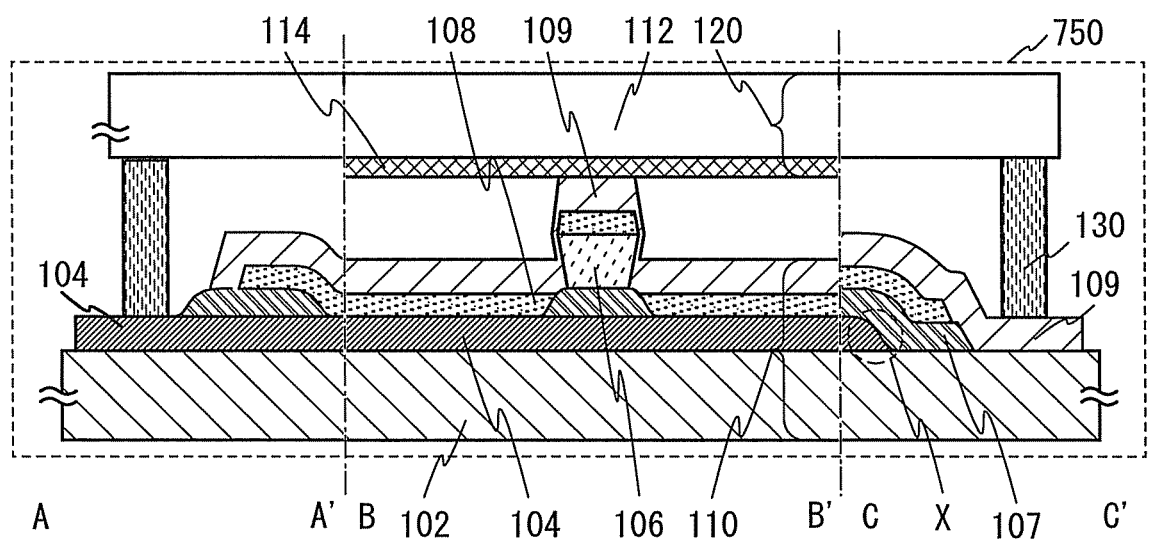

The following steps are similar to those in Embodiment 1: the sealing substrate 120 is formed by forming the conductive layer 114 over the second substrate 112 and the base substrate 110 and the sealing substrate 120 are sealed with the sealant 130, whereby the light-emitting device 750 having a top-emission structure according to one embodiment of the invention disclosed herein can be formed (see FIG. 9B).

<Effect of Light-Emitting Device in this Embodiment>

Figure 11A:
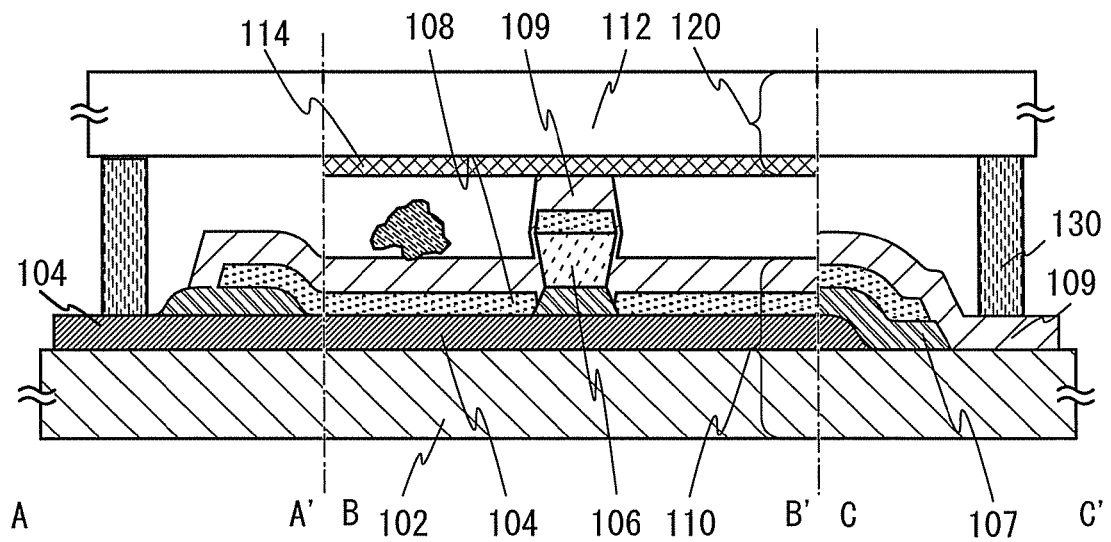
FIGS. 11A and 11B illustrate features of the light-emitting device described in Embodiment 3.

In the light-emitting device 750 having a top-emission structure formed through the above steps, the organic EL layer 108 which is formed in a contact portion between the second electrode layer 109 and the conductive layer 114 is not in contact with the organic EL layer 108 sandwiched between the first electrode layer 104 and the second electrode layer 109 (that is, a light-emitting portion); therefore, for example, in the case where a foreign substance such as a small particle is attached on the light-emitting portion at the time of sealing the base substrate 110 and the sealing substrate 120 and enlargement of the non-light-emitting region (so-called shrink phenomenon) occurs from the foreign substance as illustrated in FIG. 11A, the enlargement of the non-light-emitting region stops at the portion of the structure body 106.

Figure 11B:
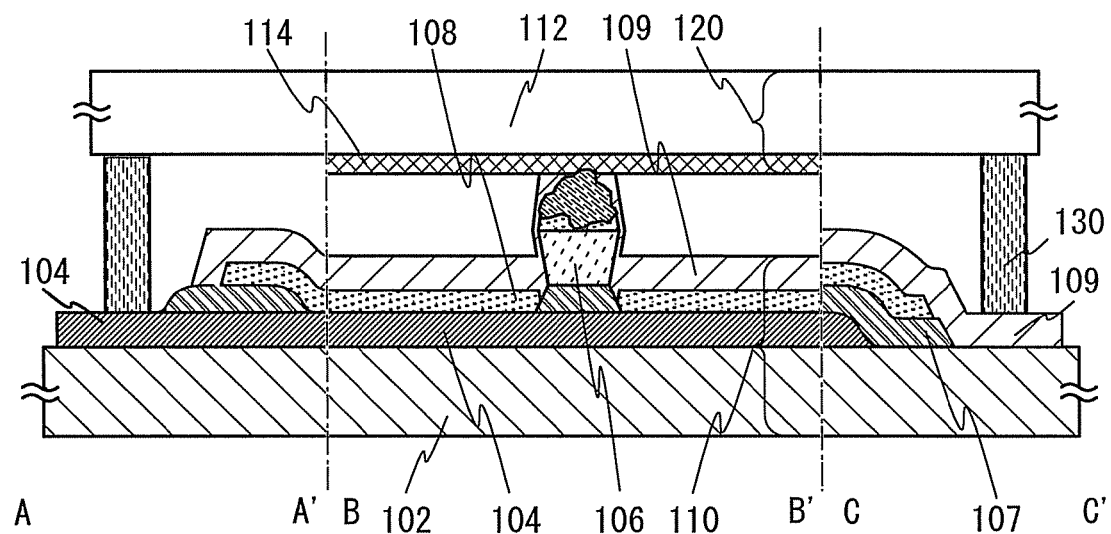

In the case where a foreign substance such as a particle is attached on the contact portion between the second electrode layer 109 and the conductive layer 114 as illustrated in FIG. 11B, the foreign substance is pushed by the sealing substrate 120 and damages the second electrode layer 109 or the organic EL layer 108. However, this portion of the organic EL layer 108 is not in contact with the light-emitting portion; therefore, enlargement of a non-light-emitting region from the foreign substance can be suppressed. Accordingly, the light-emitting device 750 can have a longer lifetime and higher reliability than the light-emitting device 150.

(Embodiment 4)

The light-emitting devices disclosed in this specification can be applied to lighting devices or electronic devices. For example, when attached to a ceiling or a wall, the light-emitting devices disclosed in this specification can be used as a lighting device 1200 and a lighting device 1202 as illustrated in FIG. 12. Further, when a plurality of light-emitting devices disclosed in this specification are attached to a wall or the like and display or non-display is selected, they can be used as a display device 1204 such as digital signage.

Note that in the case where the light-emitting device disclosed in this specification is used as the display device 1204, a plurality of units, each of which includes light-emitting devices which emit red, blue, and green that are arranged to be adjacent to one another, are arranged to be adjacent to one another, so that it can be used as a full-color display device.

When the light-emitting devices disclosed in this specification are used as the lighting devices 1200 and 1202 and the display device 1204, low power consumption and a long lifetime can be achieved and a clear irradiation state and a clear display image with less variation in light emission can be provided.

This application is based on Japanese Patent Application serial no. 2011-025844 filed with Japan Patent Office on Feb. 9, 2011, the entire contents of which are hereby incorporated by reference.

What is claimed is:

1. A light-emitting device comprising:
   a first substrate;
   a first electrode layer over the first substrate;
   a light-emitting layer comprising an organic material over the first electrode layer;
   a second electrode layer over the light-emitting layer;
   a structure body provided between the first electrode layer and the light-emitting layer so that a portion of the second electrode layer bulges;
   a conductive layer over the second electrode layer; and
   a second substrate over the conductive layer,
   wherein the portion of the second electrode layer is in contact with a portion of the conductive layer, and
   wherein a portion of a top surface of the first electrode layer is in contact with a whole bottom surface of the structure body.

2. The light-emitting device according to claim 1, wherein the conductive layer has lower resistivity than the second electrode layer.

3. The light-emitting device according to claim 1, wherein:
   the conductive layer comprises a metal wiring;
   the metal wiring comprises at least a material selected from a group consisting of gold, silver, copper, tin, aluminum, nickel, cobalt, and an alloy of any of the foregoing metals;
   the conductive layer has visible light transmittance of greater than or equal to 60%; and
   a diameter of the metal wiring is smaller than or equal to 100 nm.

4. The light-emitting device according to claim 1, wherein:
   the conductive layer comprises a carbon nanotube; and
   the conductive layer has visible light transmittance of greater than or equal to 60%.

5. The light-emitting device according to claim 1, wherein:
   the conductive layer comprises a metal particle; and
   the conductive layer has visible light transmittance of greater than or equal to 60%.

6. The light-emitting device according to claim 1, wherein:
   the conductive layer is a single-layer film or a stacked-layer film comprising at least a material selected from a group consisting of gold, platinum, silver, copper, aluminum, titanium, nickel, cobalt, chromium, tungsten, molybdenum, and an alloy of any of the foregoing metals; and
   the conductive layer has visible light transmittance of greater than or equal to 60%.

7. The light-emitting device according to claim 1, wherein resistivity of the conductive layer is less than or equal to $3 \times 10^{-4}$ Ω·m.

8. The light-emitting device according to claim 1, wherein a contact portion between the second electrode layer and the conductive layer is formed to have a linear shape.

9. The light-emitting device according to claim 1, wherein the first substrate has thermal conductivity of greater than or equal to $10 \text{ W·m}^{-1}\text{·K}^{-1}$.

10. The light-emitting device according to claim 1, wherein unevenness is formed on a surface of the first substrate which is different from a surface where the structure body is formed.

11. The light-emitting device according to claim 1, wherein the structure body comprises a resin selected from a group consisting of an acrylic resin, a polyimide resin, a polyamide resin, a polyamide-imide resin, and an epoxy resin.

12. A light-emitting device comprising:
    a first substrate;
    a first electrode layer over the first substrate;
    a light-emitting layer comprising an organic material over the first electrode layer;
    a second electrode layer over the light-emitting layer;
    a structure body provided between the first substrate and the first electrode layer so that a portion of the first electrode layer, a portion of the light-emitting layer, and a portion of the second electrode layer bulge;
    a conductive layer over the second electrode layer; and
    a second substrate over the conductive layer,
    wherein the portion of the second electrode layer is in contact with a portion of the conductive layer.

13. The light-emitting device according to claim 12, wherein the conductive layer has lower resistivity than the second electrode layer.

14. The light-emitting device according to claim 12, wherein:
    the conductive layer comprises a metal wiring;
    the metal wiring comprises at least a material selected from a group consisting of gold, silver, copper, tin, aluminum, nickel, cobalt, and an alloy of any of the foregoing metals;
    the conductive layer has visible light transmittance of greater than or equal to 60%; and
    a diameter of the metal wiring is smaller than or equal to 100 nm.

15. The light-emitting device according to claim 12, wherein:
    the conductive layer comprises a carbon nanotube; and
    the conductive layer has visible light transmittance of greater than or equal to 60%.

16. The light-emitting device according to claim 12, wherein:
the conductive layer comprises a metal particle; and
the conductive layer has visible light transmittance of greater than or equal to 60%.

17. The light-emitting device according to claim 12, wherein:
the conductive layer is a single-layer film or a stacked-layer film comprising at least a material selected from a group consisting of gold, platinum, silver, copper, aluminum, titanium, nickel, cobalt, chromium, tungsten, molybdenum, and an alloy of any of the foregoing metals; and
the conductive layer has visible light transmittance of greater than or equal to 60%.

18. The light-emitting device according to claim 12, wherein resistivity of the conductive layer is less than or equal to $3\times10^{-4}$ $\Omega\cdot$m.

19. The light-emitting device according to claim 12, wherein a contact portion between the second electrode layer and the conductive layer is formed to have a linear shape.

20. The light-emitting device according to claim 12, wherein the first substrate has thei mai conductivity of greater than or equal to 10 $W\cdot m^{-1}\cdot K^{-1}$.

21. The light-emitting device according to claim 12, wherein the structure body comprises a resin selected from a group consisting of an acrylic resin, a polyimide resin, a polyamide resin, a polyamide-imide resin, and an epoxy resin.

22. A light-emitting device comprising:
a first substrate;
a first electrode layer over the first substrate;
a light-emitting layer comprising an organic material over the first electrode layer;
a second electrode layer over the light-emitting layer;
a structure body provided between the first substrate and the first electrode layer so that a portion of the first electrode layer, a portion of the light-emitting layer, and a portion of the second electrode layer bulge;
a metal wiring over the second electrode layer; and
a second substrate over the metal wiring,
wherein:
the metal wiring comprises at least a material selected from a group consisting of gold, silver, copper, tin, aluminum, nickel, cobalt, and an alloy of any of the foregoing metals;
a diameter of the metal wiring is smaller than or equal to 100 nm; and
the second electrode layer is electrically connected to the metal wiring.

* * * * *

UNITED STATES PATENT AND TRADEMARK OFFICE
CERTIFICATE OF CORRECTION

PATENT NO. : 8,598,574 B2
APPLICATION NO. : 13/366519
DATED : December 3, 2013
INVENTOR(S) : Takuya Tsurume It is certified that error appears in the above-identified patent and that said Letters Patent is hereby corrected as shown below:

In the Specification:

Column 1, line 15; Change "organic. EL" to --organic EL--.
Column 1, line 21; Change "attached-on" to --attached on--.
Column 1, line 60; Change "forMed" to --formed--.
Column 5, line 32; Change "fanned" to --formed--.
Column 8, line 57; Change "Banned" to --formed--.
Column 8, line 58; Change "foamed" to --formed--.
Column 9, line 39; Change "faulted" to --formed--.
Column 10, line 55; Change "ineability" to --permeability--.
Column 13, line 26; Change "A-N," to --A-A',--.
Column 14, line 13; Change "device, 150." to --device 150.--.
Column 16, line 27; Change "Occurs." to --occurs.--.

In the Claims:

Column 19, line 22; Claim 20; Change "has thei mai conductivity" to --has thermal conductivity--.

Signed and Sealed this
Fifteenth Day of April, 2014

Michelle K. Lee
*Deputy Director of the United States Patent and Trademark Office*